United States Patent [19]
Nagaoka

[11] Patent Number: 5,973,984
[45] Date of Patent: Oct. 26, 1999

[54] STATIC SEMICONDUCTOR MEMORY DEVICE WITH REDUCED POWER CONSUMPTION, CHIP OCCUPIED AREA AND ACCESS TIME

[75] Inventor: Hideaki Nagaoka, Hyogo, Japan

[73] Assignee: Mitsubishi Denki Kabushiki Kaisha, Tokyo, Japan

[21] Appl. No.: 09/061,055

[22] Filed: Apr. 16, 1998

[30] Foreign Application Priority Data

Oct. 6, 1997 [JP] Japan ..................................... 9-272757

[51] Int. Cl.$^6$ .............................. G11C 16/04; G11C 8/00; G11C 11/00

[52] U.S. Cl. ................................. 365/230.03; 365/189.05; 365/154

[58] Field of Search ..................................... 365/154, 156, 365/177, 189.05, 189.08, 230.03, 51, 63, 230.06

[56] References Cited

U.S. PATENT DOCUMENTS

| | | | |
|---|---|---|---|
| 4,813,017 | 3/1989 | Wong | 365/156 |
| 5,140,550 | 8/1992 | Miyaoka et al. | 365/177 |
| 5,764,565 | 6/1998 | Sato et al. | 365/154 |
| 5,764,566 | 6/1998 | Akamatsu et al. | 365/156 |

FOREIGN PATENT DOCUMENTS 1-209813  8/1989  Japan .

*Primary Examiner*—Trong Phan
*Attorney, Agent, or Firm*—McDermott, Will & Emery

[57] ABSTRACT

Memory blocks having word lines driven into selected states independently of each other are provided in correspondence to data input/output bits respectively. Each memory cell includes a bipolar transistor and a MOS transistor. In each memory block, a current flows to a bit line only of a selected column, and a 1-bit memory cell is accessed therein. Thus, sense amplifiers and write drivers have only to be provided in numbers corresponding to that of the data bits, whereby the circuit occupying area as well as current consumption are reduced.

19 Claims, 21 Drawing Sheets

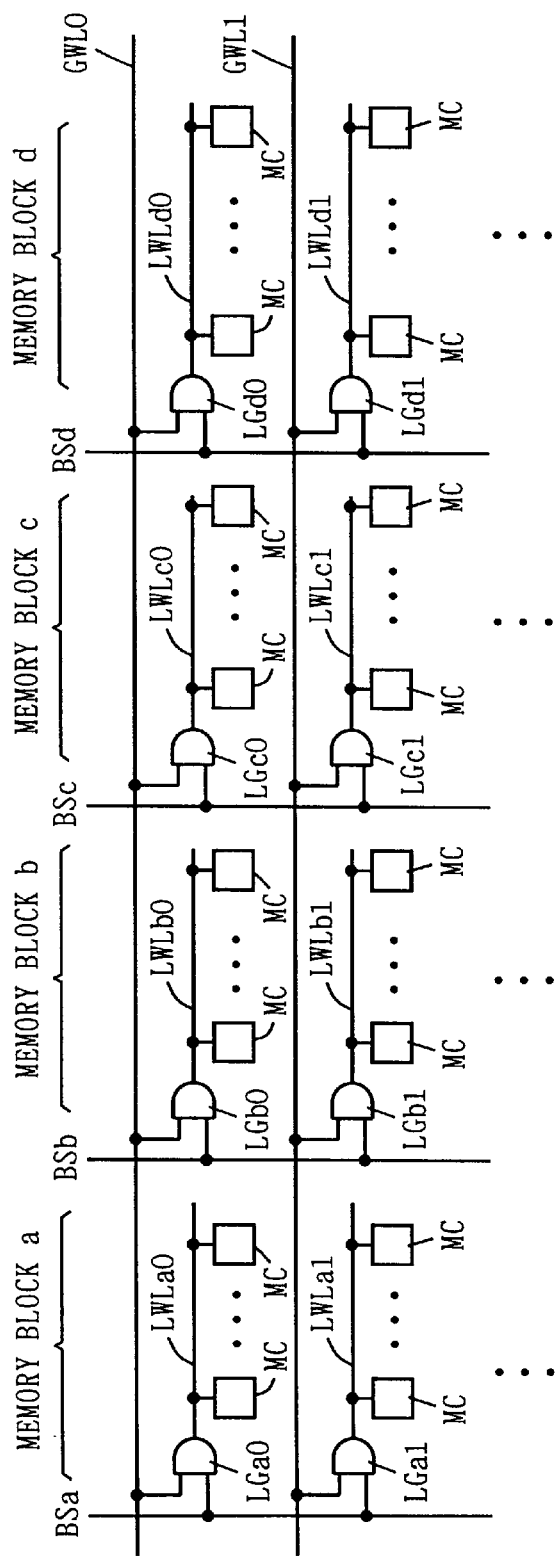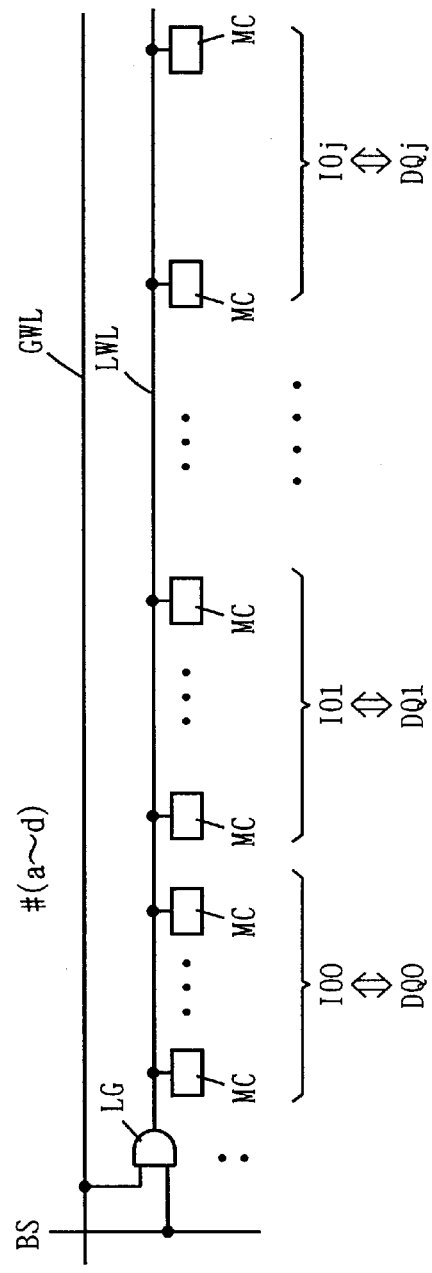
FIG. 32A PRIOR ART
FIG. 32B PRIOR ART

STATIC SEMICONDUCTOR MEMORY DEVICE WITH REDUCED POWER CONSUMPTION, CHIP OCCUPIED AREA AND ACCESS TIME

BACKGROUND OF THE INVENTION

1. Field of the Invention

The present invention relates to a static semiconductor memory device, and more particularly, it relates to a structure for reducing power consumption, a chip occupied area and an access time in the static semiconductor memory device.

2. Description of the Prior Art

FIG. 28 schematically illustrates the overall structure of a conventional static semiconductor memory device. This figure illustrates the overall structure of an exemplary static semiconductor memory device of a 1-bit word structure for inputting/outputting 1-bit data DQ.

Referring to FIG. 28, the static semiconductor memory device includes a memory array 100 having a plurality of static memory cells arranged in rows and columns. This memory array 100, the internal structure of which is described later in detail, includes a plurality of word lines arranged in correspondence to the respective rows of the memory cells and connected with the memory cells of the corresponding rows respectively, and a plurality of bit line pairs arranged in correspondence to the respective columns of the memory cells and connected with the memory cells of the corresponding columns respectively. The memory array 100 is split into a plurality of memory blocks 101a, 101b, 101c and 101d sharing the rows (word lines) along the row direction.

In order to select any memory cell in this memory array 100, the static semiconductor memory device further includes an X address buffer 102 for receiving X address signal bits AX0 to AXm specifying a row of the memory array 100, a Y address buffer 103 for receiving Y address signal bits AY0 to AYn specifying the columns in the memory blocks 101a to 101d respectively, a Z address buffer 104 for receiving Z address signal bits AZ0 and AZ1 specifying one of the memory blocks 101a to 101d, an X decoder 105 for decoding an internal address signal from the X address buffer 102 and selecting a row in the memory array 100, a Y decoder 106 for decoding an internal address signal from the Y address buffer 103 and selecting a column in each of the memory blocks 101a to 101d, and a block selector 107 for receiving an internal address signal from the Z address buffer 104 and generating a block selection signal for specifying one of the memory blocks 101a to 101d.

The X address buffer 102 includes buffer circuits XB0 to XBm provided in correspondence to the X address signal bits AX0 to AXm respectively for receiving the corresponding address signal bits AX0 to AXm and generating complementary internal address signal bits. The Y address buffer 103 includes buffer circuits YB0 to YBn provided in correspondence to the Y address signal bits AY0 to AYn respectively for receiving the corresponding address signal bits AY0 to AYn and generating complementary internal address signal bits. The Z address buffer 104 includes buffer circuits ZB0 and ZB1 provided in correspondence to the address signal bits AZ0 and AZ1 respectively for receiving the corresponding address signal bits AZ0 and AZ1 and generating complementary internal address signal bits.

The static semiconductor memory device further includes sense amplifiers 110a, 110b, 110c and 110d provided in correspondence to the memory blocks 101a to 101d respectively for amplifying data of selected memory cells of the corresponding memory blocks 101a to 101d respectively for transmission onto a common data bus 112 when activated, and write drivers 111a to 111d for amplifying the data on the common data bus 112 for writing in the selected memory cells of the corresponding memory blocks 101a to 101d respectively when activated. One of the sense amplifiers 110a to 110d is selectively driven into an active state in response to the block selection signal from the block selector 107 in a data write operation. Only the sense amplifier or the write driver provided in correspondence to the memory block specified by the block selection signal from the block selector 107 is driven into an active state. The common data bus 112 is arranged along the entire memory blocks 101a to 101d.

The static semiconductor memory device further includes an output buffer 114 for buffering internal read data read on the common data bus 112 for transmission to a data input/output terminal 113 in data reading, and an input buffer 115 activated in data writing for buffering external write data supplied on the data input/output terminal 113, generating internal write data and transmitting the same onto the common data bus 112. The operation is now briefly described.

The X decoder 105 receives and decodes the complementary internal address signal bits supplied from the X address buffer 102, for driving a row (word line) arranged in common for the memory blocks 101a to 101d into a selected state. Thus, the data of the memory cells connected to the selected row are read on the corresponding bit line pairs in the memory blocks 101a to 101d respectively. The Y decoder 106 decodes the complementary internal address signal bits from the Y address buffer 103 and selects a column in each of the memory blocks 101a to 101d. Thus, the selected columns are electrically connected to the corresponding sense amplifiers 110a to 110d and write drivers 111a to 111d in the memory blocks 101a to 110d respectively.

In data reading, only a sense amplifier provided for the selected memory block is driven into an active state in accordance with the block selection signal from the block selector 107, and the remaining sense amplifiers are held in output high-impedance states. When the memory block 101a is specified, for example, the sense amplifier 110a is activated for amplifying the data read on the selected column of the memory block 101a for transmission to the common data bus 112. The output buffer 114 further buffers the internal read data on the common data bus 112 for transmission to the data input/output terminal 113, to generate external read data DQ.

In data writing, a write driver provided for the selected memory block is driven into an active state in accordance with the block selection signal from the block selector 107. The remaining write drivers are held in output high-impedance states. When the memory block 101a is selected, for example, the write driver 111a further amplifies internal write data transmitted from the input buffer 115 onto the common data bus 112 for transmission onto the selected column of the memory block 101a, thereby writing the data in the selected memory cell.

The block selector 107 decodes the complementary address signal bits from the Z address buffer 104 and generates the block selection signal for specifying one of the four memory blocks 101a to 101d.

As shown in FIG. 28, internal (local) data buses (not shown) provided between the memory blocks 101a to 101d and the corresponding sense amplifiers 110a to 110d and write drivers 111a to 111d can be reduced in length by splitting the memory array 100 into the four memory blocks 101a to 101d, whereby loads of the internal data buses are reduced so that the data can be read/written at a high speed. In data reading, further, the data of the selected memory cell can be reliably transmitted onto the internal data bus at a high speed due to the small load thereof.

FIG. 29 more specifically illustrates the structure of the memory array 100 shown in FIG. 28. This figure representatively shows the structure of the two memory blocks 101a and 110d.

Referring to FIG. 29, each of the memory blocks 101a and 101d has the same structure and includes memory cells MC arranged in rows and columns, bit line pairs BLP0 to BLPk arranged in correspondence to the respective columns of the memory cells MC, bit line load circuits LD0 to LDk provided in correspondence to the bit line pairs BLP0 to BLPk respectively for precharging the corresponding bit line pairs BLP0 to BLPk at a prescribed potential and supplying a current to the corresponding bit lines BLP0 to BLPk in data reading, and multiplexers MX0 to MXk provided in correspondence to the bit line pairs BLP0 to BLPk respectively for selectively conducting in response to column selection signals Y0 and /Y0 to Yk and /Yk received from the Y decoder 106 shown in FIG. 28 and electrically connecting the corresponding bit line pairs BLP0 to BLPk to corresponding local data buses IOBa (or IOBd). Each of the bit line pairs BLP0 to BLPk includes bit lines BL and /BL for transmitting complementary data signals.

Each of the bit line load circuits LD0 to LDk includes resistively connected n-channel MOS transistors T0 and T1 provided between a power supply node Vcc and the respective bit lines BL and /BL.

Each of the multiplexers MX0 to MXk comprises CMOS transmission gates provided in correspondence to the bit lines BL and /BL respectively for conducting in response to corresponding complementary column selection signals Yi and /Yi (i=0 to k).

Word lines WL0, WL1, . . . are arranged in common for the respective rows of the memory cells MC forming the memory blocks 101a to 101d. These word lines WL0, WL1, . . . are connected with the memory cells MC arranged in correspondence to the corresponding rows of the memory blocks 101a to 101d respectively. In other words, the word lines WL0, WL1, . . . are arranged in common for the respective rows of the memory blocks 101a to 101d. When any word line is driven into a selected state in accordance with a row selection signal from the X decoder 105 shown in FIG. 28, therefore, a row of memory cells MC are simultaneously driven into selected states in each of the memory blocks 101a to 101d.

The local data buses IOBa to IOBd are provided for only the corresponding memory blocks 101a to 101d respectively. The sense amplifier 110a and the write driver 111a provided for the memory block 101a are enabled when a block selection signal BSa is activated. The sense amplifier 110d and the write driver 111d provided for the memory block 101d are enabled when a block selection signal BSd is activated. The sense amplifiers 110a to 110d receive a sense amplifier activation signal SAE, and the write drivers 111a to 111d receive a write driver enable signal WDE.

These sense amplifiers 110a to 110d are driven into active states when both of the sense amplifier activation signal SAE and the corresponding block selection signals BS (BSa to BSd) are in active states, for amplifying data read from the corresponding memory blocks 101a to 101d to the corresponding local data buses IOBa to IOBd respectively. The write drivers 111a to 111d are activated when both of the corresponding block selection signals BS (BSa to BSd) and the write driver enable signal WDE are in active states, for amplifying data supplied onto the common data bus 112 and transmitting write data to the corresponding local data buses IOBa to IOBd respectively. The operation is now briefly described.

The potential of a selected word line rises in accordance with a word line selection signal from the X decoder 105 shown in FIG. 28. Consider the case of driving the word line WL0 into a selected state. In this state, data stored in the memory cells MC connected with this word line WL0 are read on the corresponding bit line pairs BLP0 to BLPk in the memory blocks 101a to 101d respectively. At this time, a potential difference according to the data stored in each memory cell MC is caused between the bit lines BL and /BL in each of the bit line pairs BLP0 to BLPk due to a supply current (column current) from each of the bit line load circuits LD0 to LDk.

Further, a column is selected in each of the memory blocks 101a to 101d in accordance with the column selection signals Yi and /Yi from the Y decoder 106 shown in FIG. 28. Consider the case of selecting the bit line pairs BLP0. In this case, the multiplexers MX0 conduct to connect the bit line pairs BLP0 to the corresponding local data buses IOBa to IOBd in the memory blocks 101a to 101d respectively. The sense amplifier activation signal SAE is activated in data reading, while the write driver enable signal WDE is activated in data writing. The sense amplifier activation signal SAE and the write driver enable signal WDE are internally generated in accordance with an output enable signal OE and a write enable signal WE externally supplied respectively.

A single memory block is selected in accordance with the block selection signal BS from the block selector 107 (see FIG. 28). Consider that the memory block 101a is selected and the block selection signal BSa is activated. In this state, the sense amplifier 110a is activated in data reading, for amplifying memory cell data read on the local data bus IOBa for transmission onto the common data bus 112. The write driver 111a is activated in data writing, for generating internal write data on the local data bus IOBa in accordance with write data on the common data bus 112 and writing the same in the memory cell MC through the multiplexer MX0.

In the non-selected memory blocks 101b to 101d, the sense amplifiers 110b to 110d and the write drivers 111b to 111d are in output high-impedance states. Thus, data are read from or written in only the memory block 101a specified by the block selection signal BSa from the block selector 107.

As shown in FIG. 29, the lengths of the local data buses IOBa to IOBd provided for the memory blocks 101a to 101d are reduced and load capacitances thereof are reduced since the memory array 100 is split into the plurality of memory blocks 101a to 101d. Thus, memory cell data read in the corresponding memory blocks 101a to 101d are correctly transmitted to the corresponding sense amplifiers 101a to 101d at a high speed, for enabling high-speed data reading. Also in data writing, the write drivers 111a to 111d, which must drive the local data buses IOBa to IOBd having small loads as well as the bit line pairs BLP0 to BLPk through the corresponding multiplexers MX0 to MXk, can drive one of the bit line pairs BLP0 to BLPk corresponding to the selected column to potential levels corresponding to write data in accordance with the write data at a high speed due to the small loads of the local data buses IOBa to IOBd, for enabling high-speed data writing.

FIG. 30 schematically illustrates the structure of a single memory cell MC. Referring to FIG. 30, the memory cell MC includes n-channel MOS transistors Qa and Qb conducting in response to a signal potential on a word line WL for connecting storage nodes SN and /SN to the bit lines BL and /BL respectively, an n-channel MOS transistor Qc connected between the storage node SN and a ground node Vss with its gate connected to the storage node /SN, an n-channel MOS transistor Qd connected between the storage node /SN and the ground node Vss with its gate connected to the storage node SN, and resistive elements Za and Zb for pulling up the storage nodes SN and /SN to a power supply voltage Vcc level respectively. The resistive elements Za and Zb are formed by polysilicon resistances or thin-film transistors. The MOS transistors Qc and Qd form a flip-flop, for latching data of the storage nodes SN and /SN. The operation of the memory cell MC shown in FIG. 30 is now described with reference to FIG. 31.

Consider that the storage nodes SN and /SN hold data of logical high and low levels respectively, as shown in FIG. 31. In this state, the MOS transistors Qc and Qd are in OFF and ON states respectively. The resistive elements Za and Zb have extremely high resistance values, and only a small current flows through the resistive elements Za and Zb.

When the word line WL is selected and its potential increases, the MOS transistors Qa and Qb conduct to electrically connect the storage nodes SN and /SN to the bit lines BL and /BL respectively. The bit lines BL and /BL are supplied with a current from the bit line load circuit LD. The potential of the storage node SN is at a high level, and no current from the bit line load circuit LD flows into the storage node SN and the bit line BL maintains the high level. Because the storage node /SN is at a low level, on the other hand, the current from the bit line load circuit LD flows through the MOS transistors Qb and Qd to reduce the potential of the bit line /BL. The potential of the bit line /BL is set by the ratio of its resistance to the ON resistances of the MOS transistors Qb and Qd. Such potential reduction of the bit line /BL results in a potential difference between the bit lines BL and /BL. The corresponding sense amplifier (any of 110a to 110d) shown in FIG. 29 senses and amplifies the potential difference between the bit lines BL and /BL.

The current, called a column current Ic, flowing from the bit line BL (/BL) to the storage node SN (/SL) storing the low level data flows in all columns in selection of the word line WL. When the word line WL makes a transition to a non-selected state, the storage nodes SN and /SN return to the original potential levels by latch circuits of the MOS transistors Qc and Qd.

In data writing, the word line WL is driven into a selected state similarly to the case of data reading, to cause a potential difference between the bit lines BL and /BL. In this case, the corresponding write driver drives the bit lines BL and /BL into high and low levels respectively in response to the write data, and sets the potentials of the storage nodes SN and /SN at levels corresponding to the write data. Thus, the data is written.

When a word line is driven into a selected state in the conventional static semiconductor memory device, the column current Ic shown in FIG. 31 flows to all memory cells MC connected with the selected word line. If a number of memory cells MC are connected to a single word line, therefore, the total value of the column current Ic is so increased that current consumption is increased and a low current consumptionization cannot be implemented. In order to reduce current consumption by such column current Ic, the number of the memory cells MC connected to a single word line must be reduced. Techniques of reducing the number of memory cells connected to a single word line include a word line driving system called a divided word line structure.

FIG. 32A schematically illustrates the structure of a memory array of the divided word line arrangement. Referring to FIG. 32A, the memory array is divided into four memory blocks a, b, c and d. Global word lines GWL0, GWL1, . . . are arranged in common for respective rows of the memory blocks a to d. A row selection signal from the X decoder 105 shown in FIG. 28 is transmitted to the global word lines GWL0, GWL1, . . .

In each of the memory blocks a to d, local word lines LWL are arranged in correspondence to respective rows of memory cells MC and connected with the memory cells MC of the corresponding rows. Referring to FIG. 32A, local word lines LWLa0, LWLb0, LWLc0 and LWLd0 are arranged in correspondence to the global word line GWL0, and local word lines LWLa1, LWLb1, LWLc1 and LWLd1 are arranged in correspondence to the global word line GWL1 in the memory blocks a to d respectively.

Local decoders LGa0 to LGd0 and LGa1 to LGd1 for receiving signal potentials from the corresponding global word lines GWL0 and GWL1 and memory block selection signals BS (BSa to BSd) are arranged in correspondence to the local word lines LWLa0 to LWLd 0, LWLa1 to LWLd1, . . . These local decoders LGa0 to LGd0, LGa1 to LGd1, . . . drive the corresponding local word lines LWL into selected states when the signal potentials on the corresponding global word lines GWL0, GWL1, . . . are in selected states and the corresponding block selection signals BS (BSa to BSd) are in active states. The block selector 107 shown in FIG. 28 supplies one of the block selection signals BSa to BSd, for specifying one of the memory blocks a to d.

In operation, a single global word line and a single block selection signal are driven into selected states. Consider the case of driving the global word line GWL0 and the block selection signal BSa into selected states. In this case, an output signal from the local decoder LGa0 enters an active state to drive the corresponding local word line LWLa0 into a selected state. Therefore, the column current Ic flows only to the memory cells MC connected to the local word line LWLa0. In the non-selected memory blocks b to d, the local word lines LWLb 0 to LWLd 0 and LWLb1 to LWLd1 are in non-selected states since all block selection signals BSb to BSd are in non-selected states. Therefore, all memory cells MC are in non-selected states and supplied with no column current Ic in the non-selected memory blocks b to d. In the memory block a, the output signal of the local decoder LGa1 is in an inactive state and the local word line LWLa1 maintains a non-selected state even if the block selection signal BSa is driven into a selected state, since the global word line GWL1 is in a non-selected state.

In the divided word line structure shown in FIG. 32A, therefore, the column current Ic flows only in the selected memory block a, and hence current consumption in selection of the memory cells MC can be reduced.

Only a single memory block is driven into a selected state in the divided word line structure, whereby only a single write driver and a single sense amplifier may be provided commonly for all the memory blocks in case of inputting/outputting 1-bit data. In a structure of inputting/outputting multi-bit data, however, a single memory block must be divided in correspondence to the data bits respectively. Namely, a single memory block # (any of a to d) is split into a plurality of subblocks IO0 to IOj as shown in FIG. 32B.

FIG. 32B shows a single global word line GWL and a local word line LWL arranged in correspondence thereto. When the block selection signal BS and the global word line GWL are driven into selected states, the local word line LWL is also driven into a selected state for selecting 1-bit memory cell in each of the subblocks IO0 to IOj. These subblocks IO0 to IOj correspond to data bits DQ0 to Dqj respectively. A column selection signal outputted from the Y decoder 106 shown in FIG. 28 simply selects 1-bit memory cell from each of the subblocks IO0 to IOj.

In case of driving only a single memory block into a selected state for inputting/outputting multi-bit data as shown in FIG. 32B, the following problems arise.

FIG. 33 schematically illustrates the overall structure of a static semiconductor memory device for inputting/outputting a 2-bit word. This static semiconductor memory device includes four memory blocks #0 to #3. Each of the memory blocks #0 to #3 is divided into two subblocks IO0 and IO1 in correspondence to 2-bit data DQ0 and DQ1 respectively. Consider that the memory blocks #0 and #1 share a global word line in the divided word line structure and the memory blocks #2 to #3 share another global word line in the divided word line structure. The global word line is driven into a selected state in the memory blocks #0 and #1 or #2 and #3. The global word lines are arranged in common for the memory blocks #0 and #1 and for the memory blocks #2 and #3 respectively, and local decoders are arranged for respective local word lines to be supplied with block selection signals, thereby implementing block splitting of the divided word line structure.

Each of the memory blocks #0 to #3 is provided with sense amplifiers and write drivers for reading/writing internal data from/in the subblocks IO0 and IO1 respectively. The memory block #0 is provided with a sense amplifier SA00 for receiving a block selection signal BS0 and a sense amplifier activation signal SAE and a write driver WD00 for receiving the block selection signal BS0 and a write driver enable signal WDE for the subblock IO0. The memory block #0 is also provided with a sense amplifier SA01 for receiving the block selection signal BS0 and the sense amplifier activation signal SAE and a write driver WD01 for receiving the block selection signal BS0 and the write driver enable signal WDE for the subblock IO1.

The memory block #1 is provided with a sense amplifier SA10 for receiving a block selection signal BS1 and the sense amplifier activation signal SAE and a write driver WD10 for receiving the block selection signal BS1 and the write driver enable signal WDE for the subblock IO0, and a sense amplifier SA11 for receiving the block selection signal BS1 and the sense amplifier activation signal SAE and a write driver WD11 for receiving the block selection signal BS1 and the write driver enable signal WDE for the subblock IO1.

The memory block #2 is provided with a sense amplifier SA20 for receiving a block selection signal BS2 and the sense amplifier activation signal SAE and a write driver WD20 for receiving the block selection signal BS2 and the write driver enable signal WDE for the subblock IO0, and a sense amplifier SA21 for receiving the block selection signal BS2 and the sense amplifier activation signal SAE and a write driver WD21 for receiving the block selection signal BS1 and the write driver enable signal WDE for the subblock IO1.

The memory block #3 is provided with a sense amplifier SA30 for receiving a block selection signal BS3 and the sense amplifier activation signal SAE and a write driver WD30 for receiving the block selection signal BS3 and the write driver enable signal WDE for the subblock IO0, and a sense amplifier SA31 for receiving the block selection signal BS3 and the sense amplifier activation signal SAE and a write driver WD31 for receiving the block selection signal BS3 and the write driver enable signal WDE for the subblock IO1.

Internal common data buses 120a and 120b are provided in common for the memory blocks #0 to #3. The internal common data bus 120a is connected with the sense amplifiers SA00, SA10, SA20 and SA30 and the write drivers WD00, WD10 WD20 and WD30 provided for the subblocks IO0, and the internal common data bus 120b is connected with the sense amplifiers SA01, SA11, SA21 and SA31 and the write drivers WD01, WD11, WD21 and WD31 provided for the subblocks IO1.

These internal common data buses 120a and 120b are connected with input/output buffers 122a and 122b provided in the vicinity of pads (data input/output nodes) 121a and 121b respectively.

Only a single memory block is driven into a selected state in the structure shown in FIG. 33, so that 1-bit memory cell is selected in each of the two subblocks IO0 and IO1 of the selected memory block and data are transferred to/received from the selected memory cells through the input/output buffers 122a and 122b and the common data buses 120 and 120b.

In the block division structure dividing the memory blocks into the subblocks in correspondence to the data bits respectively, however, the sense amplifiers and the write drivers must be provided in correspondence to the respective data bits, leading to large occupied areas by the sense amplifiers and the write drivers.

The sense amplifiers and the write drivers of the subblocks provided for the same data bits are connected to the same common data bus line 120a or 120b. The sense amplifiers and the write drivers provided for non-selected memory blocks are brought into output high-impedance states, to exert no bad influence on reading/writing of memory cell data for the selected memory block. However, a number of sense amplifiers and write drivers are connected to each internal common data bus, and hence the load capacitance of the bus is so increased that data cannot be transferred at a high speed.

Not only in the divided block structure shown in FIG. 33 but also in the array structure shown in FIG. 28, the block selection signal must be supplied to the sense amplifier or the write driver for controlling activation/inactivation thereof in case of reading/writing data from/in one of a plurality of memory blocks. Thus, the length of an interconnection line for transmitting the block selection signal is increased to increase the occupying area of the interconnection line, and the block selection signal cannot be transmitted at a high speed.

Further, each of the common data buses 120a and 120b is arranged in common for a plurality of memory blocks, and hence its length is increased, the load is increased, an internal data signal cannot be transmitted at a high speed, and high-speed access cannot be implemented. In case of employing such common data buses 120a and 120b, further, output drivability of input buffers included in the input/output buffers 122a and 122b and the sense amplifiers SA00 to SA31 must be increased for driving relatively large loads at a high speed. Thus, excessive loads must be charged/ discharged in charging/discharging of signal lines, leading to increase of power consumption.

Particularly in case of increasing the output drivability of output buffers in the input/output buffers 122a and 122b in order to compensate for signal propagation delay in the common data buses 120a and 120b, the input/output pads (data input/output nodes) 121a and 121b are driven at a high speed, leading to ringing resulting from undershoot or overshoot in the input/output pads 121a and 121b. Thus, a long time is required for stably outputting definite data, and the data cannot be read at a high speed.

SUMMARY OF THE INVENTION

An object of the present invention is to provide a static semiconductor memory device which can stably input/ output data at a high speed with low current consumption without increasing its chip occupying area.

The static semiconductor memory device according to the present invention includes a plurality of memory array blocks arranged in correspondence to a plurality of data input/output nodes respectively, for transferring/receiving signals to/from the corresponding data input/output nodes. Each of the plurality of memory array blocks includes a plurality of memory cells arranged in rows and columns, a plurality of word lines arranged in correspondence to the respective rows to be connected with the memory cells of the corresponding rows respectively, and a plurality of bit line pairs arranged in correspondence to the respective columns to be connected with the memory cells of the corresponding columns respectively. Each of the memory cells includes a bipolar transistor coupled with the corresponding bit line pair and with a data storage part formed by insulated gate field-effect transistors and transfers/receives storage data to/from bit lines of the corresponding bit line pair through the bipolar transistor.

A word line of each of the memory array blocks is electrically isolated from those of the remaining memory array blocks.

Due to the structure of forming each memory cell by the bipolar transistor and the insulated gate field-effect transistor and transferring a data signal between the bit lines and the data storage part of the memory cell, a current flows only in a selected column in each memory array block so that no current flows in the remaining non-selected columns. Thus, current consumption is remarkably reduced. The memory array blocks are arranged in correspondence to data bits respectively, whereby no block selection signal may be supplied to each memory array block for controlling coupling between each data bit and the memory array block, whereby the control is simplified and an interconnection area is reduced. Further, each memory array block is arranged in correspondence to each data bit (IO), whereby the memory block can be provided with only a single sense amplifier and a single write driver, and the circuit occupying area can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 32A illustrates a conventional array of a divided word line system, and

FIG. 32B schematically illustrates the correspondence between a single memory block and data input/output bits.

DESCRIPTION OF THE PREFERRED EMBODIMENTS

Embodiment 1

Figure 1:
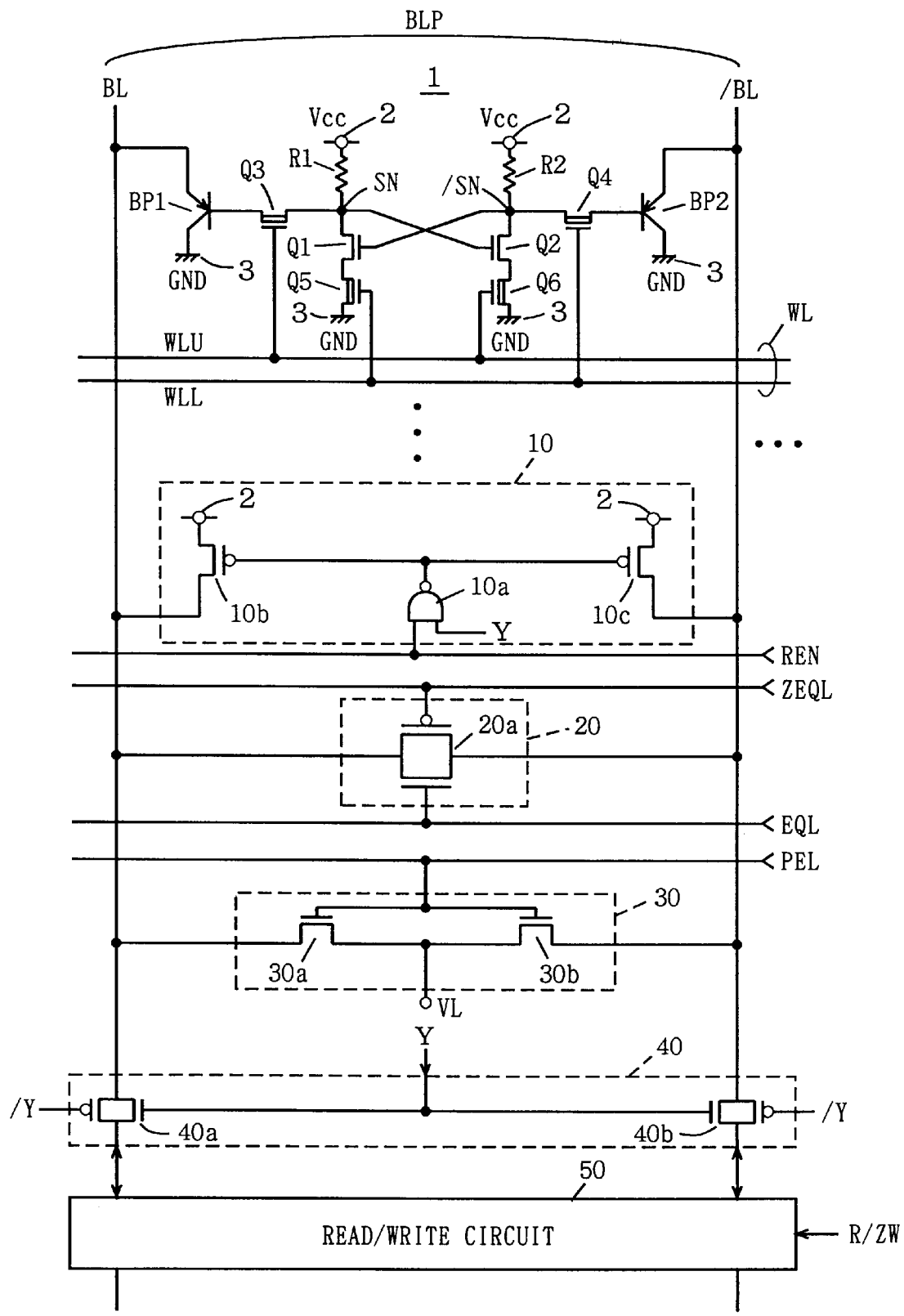
FIG. 1 illustrates the structure of a principal part of a static semiconductor memory device according to an embodiment 1 of the present invention.

FIG. 1 illustrates the structure of a principal part of a static semiconductor memory device according to an embodiment 1 of the present invention. This figure schematically shows the structure of a part related to a pair of bit lines BL and /BL. A memory cell 1 is arranged in correspondence to an intersection between the pair of bit lines BL and /BL and a word line WL. The word line WL includes a pair of subword lines WLU and WLL.

The memory cell 1 includes a high-resistance resistive element R1 connected between a power supply node 2 supplying a power supply voltage Vcc and a storage node SN, a high-resistance resistive element R2 connected between power supply node 2 and a storage node /SN, cross-coupled drive transistors Q1 and Q2 formed by n-channel MOS transistors for holding complementary data in the storage nodes SN and /SN, a pnp bipolar transistor BP1 having an emitter connected to the bit line BL and a collector connected to a voltage source (ground node) 3 supplying a ground voltage GND, a pnp bipolar transistor BP2 having an emitter connected to the bit line /BL and a collector connected to another ground node 3, an access transistor Q3 formed by an n-channel MOS transistor conducting when a signal potential on the subword line WLU is at a high level, for electrically connecting a base electrode node of the bipolar transistor BP1 to the storage node SN, an access transistor Q4 formed by an n-channel MOS transistor conducting when a signal potential on the subword line WLL is at a high level, for connecting the storage node /SN to a base electrode node of the bipolar transistor BP2, a cut transistor Q5 formed by an n-channel transistor conducting in response to a signal potential on the subword line WLL, for connecting another conduction node (source) of the drive transistor Q1 to the ground node 3, and a cut transistor Q6 formed by an n-channel MOS transistor conducting in response to a signal potential on the subword line WLU, for electrically connecting the source of the drive transistor Q2 to the ground node 3.

The threshold voltages Vth of the access transistors Q3 and Q4 and the cut transistors Q5 and Q6 are rendered smaller than those of the drive transistors Q1 and Q2. Due to such reduction of the threshold voltages vth, the MOS transistors Q3, Q4, Q5 and Q6 are brought into conducting states at a high speed. The threshold voltages of the drive transistors Q1 and Q2 are relatively increased, thereby stabilizing the latching state of the cross-coupled MOS transistors Q1 and Q2 (conducting/non-conducting states of the MOS transistors Q1 and Q2 remain unchanged against slight fluctuation of the potentials of the storage nodes SN and /SN). Thus, the memory cell 1 is accessible at a high speed and can reliably hold data under a low power supply voltage condition.

Bit line peripheral circuits include a read load circuit 10 for supplying currents to the bit lines BL and /BL from power supply nodes 2 in response to activation of a read activation signal RED and a column selection signal Y in data reading, a bit line equalize circuit 20 activated, in response to activation of bit line equalize instruction signals EQL and ZEQL, for equalizing the potentials of the bit lines BL and /BL with each other, a bit line precharge circuit 30 activated, in response to activation of a bit line precharge instruction signal PEL, for precharging the bit lines BL and /BL at a low prescribed voltage VL level, a multiplex circuit 40 for selecting the bit lines BL and /BL in accordance with the column selection signal Y, and a read/write circuit 50 for performing data reading/writing with respect to the bit lines BL and /BL selected by the multiplex circuit 40.

The read/write circuit 50 reads or writes data in accordance with read/write instruction signal R/ZW. This read/write circuit 50 includes a sense amplifier, and includes a write driver or a write gate as a write circuit, for example. This structure is described later. The read/write circuit 50 is coupled to an internal common data bus provided in correspondence to a predetermined data input/output node.

The read load circuit 10 includes a NAND circuit 10a receiving the read activation signal RED and the column selection signal Y, and p-channel MOS transistors 10b and 10c conducting, when an output signal from the NAND circuit 10a is at a low level of an active state, for supplying the currents from the power supply nodes 2 to the bit lines BL and /BL respectively.

The bit line equalize circuit 20 includes a CMOS transmission gate 20a conducting, in response to activation of the bit line equalize instruction signals EQL and ZEQL, for electrically short-circuiting the bit lines BL and /BL.

The bit line precharge circuit 30 includes n-channel MOS transistors 30a and 30b conducting, in activation of the bit line precharge instruction signal PEL, for transmitting the prescribed voltage VL to the bit lines BL and /BL respectively. The prescribed voltage VL is at a level higher than the ground voltage GND and lower than emitter-to-base forward voltage drop of the bipolar transistors BP1 and BP2 included in the memory cell 1.

Figure 2:
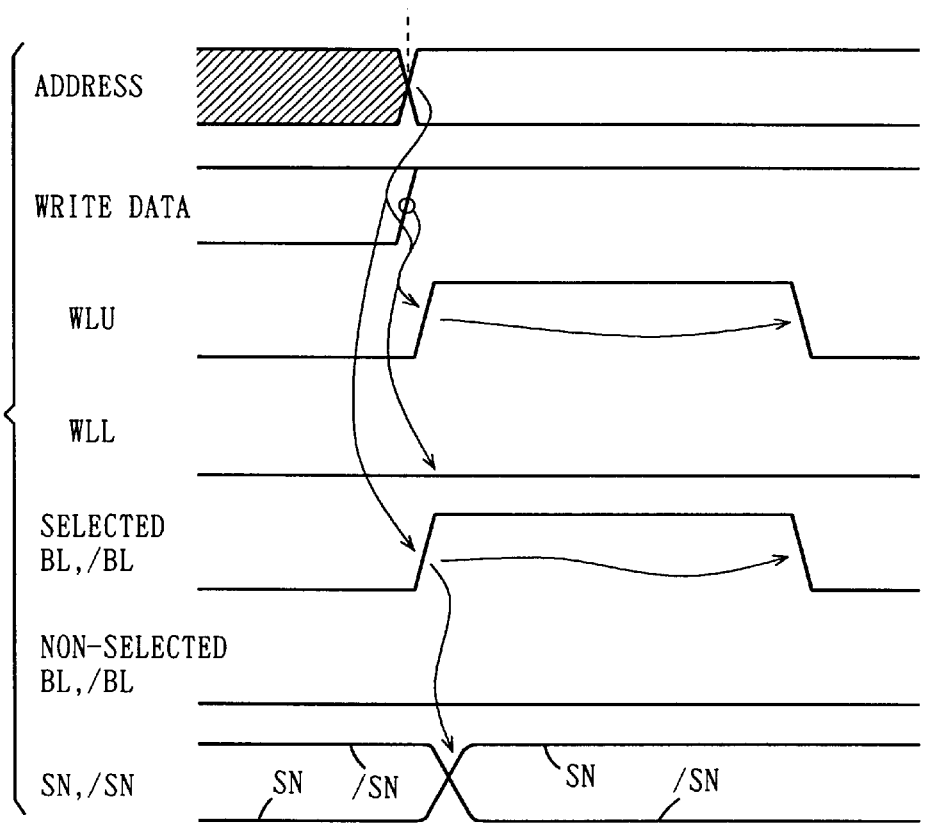
FIG. 2 is a signal waveform diagram representing a data write operation of the static semiconductor memory device shown in FIG. 1.

The multiplex circuit 40 includes CMOS transmission gates 40a and 40b conducting, in response to the column selection signals Y and /Y, for electrically connecting the bit lines BL and /BL to the read/write circuit 50 respectively. Data write and read operations for the memory cell 1 shown in FIG. 2 are now described. First, the data write operation is described with reference to FIG. 2.

The static semiconductor memory device selects a word line and a bit line pair in accordance with address transition. Consider an operation of writing high-level data in the storage node SN holding low-level data.

When an address signal changes, the word line WL and the pair of bit lines BL and /BL are selected in accordance with this address signal. The word line WL corresponding to the addressed row is driven into a selected state. When the write data is at a high level, the subword line WLU of the selected word line WL is driven into a high level in accordance with the write data, while the subword line WLL maintains a low level. Thus, the access transistor Q3 enters an ON state, while the access transistor Q4 maintains an OFF state. The read/write circuit 50 drives the bit lines BL and /BL into high levels through the multiplex circuit 40.

The subword lines WLL and WLU are at low and high levels respectively, whereby the cut transistors Q5 and Q6 are in OFF and ON states. The terms "ON state" and "OFF state" indicate a complete conducting state and a complete non-conducting state causing only a leakage current respectively. The read/write circuit 50 increases the potential of the bit line BL which has heretofore been precharged at a low level and forward-biases the emitter and the base of the bipolar transistor BP1, whereby the bipolar transistor BP1 conducts so that a collector current flows from the bit line BL to the ground node 3 through the bipolar transistor BP1.

At this time, a base current of the bipolar transistor BP1 flows to the storage node SN. The cut transistor Q5 is in an OFF state, and the potential of the storage node SN increases due to the base current of the bipolar transistor BP1. The value of the base current of the bipolar transistor BP1 is decided by the current amplification factor and the collector current of the bipolar transistor BP1. A bipolar transistor generally has a high current amplification factor, and hence most part of the current flowing through the bipolar transistor BP1 from the bit line BL flows to the ground node 3 as the collector current.

On the other hand, the cut transistor Q6 is in an ON state. When the voltage of the storage node SN exceeds the threshold voltage of the drive transistor Q2, the drive transistor Q2 conducts to drive the storage node /SN to the ground voltage GND level. In accordance with the voltage drop of storage node /SN, the drive transistor Q1 shifts to an OFF state to completely cut off the path of the base current of the bipolar transistor BP1 flowing to the ground node 3 from the storage node SN through the MOS transistor Q1 and the cut transistor Q5 having a low threshold voltage.

The voltage of the storage node SN increases at a high speed due to the base current of the bipolar transistor BP1. The potential of the storage node SN increases with a potential rise of the bit line BL, with the emitter-to-base voltage of the bipolar transistor BP1 maintained substantially at a constant value. Therefore, a relatively large collector current flows in the bipolar transistor BP1 in data writing. When the voltage level of the storage node SN increases responsively to a relatively large base current, the emitter-to-base voltage of the bipolar transistor BP1 is maintained at a substantially constant value (emitter-to-base forward voltage drop Vbe), and hence only a base current of about a small leakage current flows.

The access transistor Q4 is in an OFF state, and the storage node /SN is discharged to the ground voltage GND level by the drive transistor Q2 and the cut transistor Q6 following the potential rise of the storage node SN. The access transistor Q4 is in the OFF state when the voltage level of the bit line /BL increases, and the base voltage level of bipolar transistor BP2 immediately increases when the base current flows, to maintain an OFF state.

When the data writing is completed, the potential of the subword line WLU reduces to a low level after a lapse of a prescribed time from the address transition as described later, and the access transistor Q3 and the cut transistor Q6 enter OFF states. In this state, the storage nodes SN and /SN are coupled to the power supply nodes 2 through the high-resistance resistive elements R1 and R2. The high-level data of the storage node SN is reliably held at the high level. The high-resistance resistive elements R1 and R2 have extremely small current drivability only compensating for leakage currents of the storage nodes SN and /SN. Thus, the storage node /SN is held at a low level substantially equal to the ground voltage GND.

In case of writing low-level data, the subword lines WLU and WLL are held at and driven into low and high levels, contrarily to the case of writing high-level data. The bit lines BL and /BL are driven into high levels. In this case, therefore, the voltage level of the storage node /SN increases due to the base current of the bipolar transistor BP2 and the voltage of the storage node SN reduces to the ground voltage GND level, and the low-level data is written.

The voltages of the storage nodes SN and /SN can be reliably set at the levels according to the write data due to the latching operation of the drive transistors Q1 and Q2 by setting the voltage levels of the subword lines WLU and WLL in accordance with the logic level of write data, even if the power supply voltage Vcc reduces. Further, the access transistors Q3 and Q4 and the cut transistors Q5 and Q6 having low threshold voltages can be set in ON/OFF states in response to the write data, so that the data can be reliably written in the storage nodes SN and /SN even under a low power supply voltage Vcc.

In case of employing a MOS transistor having a low threshold voltage, its leakage current increases in an OFF state. In a data holding state, however, the drive transistor Q1 or Q2 provided for the storage node SN or /SN holding high-level data receives a low-level voltage at its gate and enters an OFF state so that no current flows to the cut transistor Q5 or Q6 having a low threshold voltage, whereby the low threshold voltage of the cut transistor Q5 or Q6 exerts no bad influence in data holding.

Also as to the access transistor Q3 or Q4, the base voltage of the corresponding bipolar transistor BP1 or BP2 increases even if a leakage current is caused when the storage node SN or /SN holds high-level data, whereby the bipolar transistor BP1 or BP2 shifts a deeper OFF state (the bit line BL or /BL is precharged at a low level) and the gate and the source of the access transistor Q3 or Q4 are reverse-biased so that the access transistor Q3 or Q4 enters a deeper OFF state.

When the corresponding storage node SN or /SN holds low-level data, on the other hand, the access transistor Q3 or Q4 merely equalizes the base voltage of the corresponding bipolar transistor BP1 or BP2 with the voltage level of the corresponding storage node SN or ISN. In this case, the source and the drain are at the same voltage level to form no path for a leakage current (the bipolar transistor BP1 or BP2 maintains an OFF state since the corresponding bit line BL or /BL is at a low level). Thus, no bad influence is exerted on the data holding operation even when the access transistors Q3 and Q4 and the cut transistors Q5 and Q6 are formed by MOS transistors of low threshold voltages.

Figure 3:
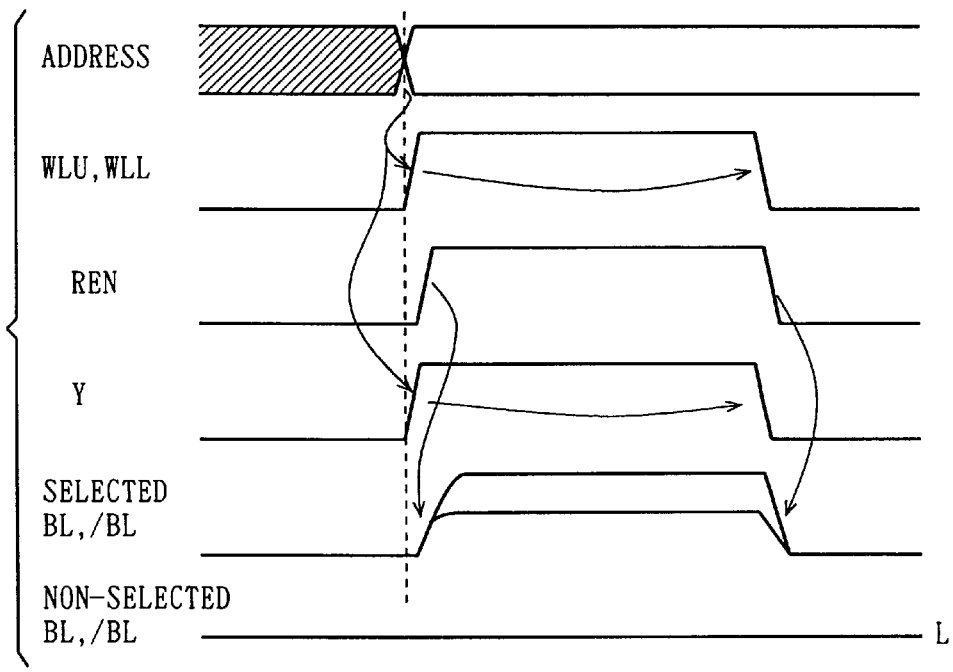
FIG. 3 is a signal waveform diagram representing a data read operation of the static semiconductor memory device shown in FIG. 1.

The data read operation is now described with reference to FIG. 3.

In advance of data reading, the bit line equalize circuit 20 and the bit line precharge circuit 30 precharge the bit lines BL and /BL at the prescribed low voltage VL. This prescribed voltage VL brings the bipolar transistors BP1 and BP2 into OFF states.

When an address signal changes, The word line WL and the pair of bit lines BL and /BL are selected similarly to the case of data writing. In data reading, the potentials of the subword lines WLU and WLL are raised to high levels and the access transistors Q3 and Q4 enter ON states, for electrically connecting the storage nodes SN and /SN to the base electrode nodes of the bipolar transistors BP1 and BP2 respectively.

The read activation signal RED (read/write instruction signal R/ZW) is activated at a prescribed timing, an output signal of the NAND circuit 10a included in the read load circuit 10 enters an active state of a low level, the p-channel MOS transistors 10b and 10c enter ON states, and currents are supplied to the bit lines BL and /BL to increase the potentials thereof. For bit lines BL and /BL (not shown) corresponding to a non-selected column, an output signal of a NAND circuit 10a in a read load circuit 10 is at a high level and p-channel MOS transistors 10b and 10c maintain OFF states, whereby the bit lines BL and /BL of the non-selected column hold low-level precharge voltages.

Consider that the storage node SN holds low-level data. When the voltage of the bit line BL exceeds the emitter-to-base voltage (built-in voltage Vbe) of the bipolar transistor BP1 in this state, the emitter-to-the base of the bipolar transistor BP1 is forward-biased, the bipolar transistor BP1 conducts, a large collector current flows, and a potential rise of the bit line BL is suppressed. Current suppliability of the MOS transistor 10b is substantially equal to or slightly larger than that of the bipolar transistor BP1, and the potential of the bit line BL is substantially held at the level of the built-in voltage Vbe (about 0.7 to 1.1 V).

On the other hand, the bipolar transistor BP2 having the base electrode node connected with the storage node /SN holding high-level data maintains an OFF state even if the voltage of the bit line /BL increases since its emitter to base are reverse-biased, whereby the voltage of the bit line /BL increases to a high level (the power supply voltage Vcc level). The potential difference caused between the bit lines BL and /BL is transmitted to the read/write circuit 50 through the multiplex circuit 40 and amplified by a read circuit included therein, and then internal read data is produced.

In the data reading, the base current flows to the storage node SN storing the low-level data through the bipolar transistor BP1. However, this base current is sufficiently smaller than the collector current, and can be rendered sufficiently smaller than the current drivability of the drive transistor Q1 and the cut transistor Q5. The value of the base current is decided by the current amplification factor hFE of the bipolar transistors BP1 and BP2. When the ratio of the current Id flowing through the drive transistor Q1 and the cut transistor Q5 to the base current Ib is 3:1, for example, the memory cell 1 can stably store information. This ratio of 3:1 corresponds to the ratio of the current drivability of a drive transistor to that of an access transistor in a general static memory cell. In order to implement bistability in input/output transmission characteristics of the memory cell formed by inverter latches, the ratio of the current drivability of the drive transistor to that of the access transistor is generally set at 3:1. In the structure of the memory cell 1 shown in FIG. 1, the base current of the bipolar transistors BP1 and BP2 decides a driving current for the access transistor of the conventional static memory cell.

From the relation between the base current and the collector current, therefore, the memory cell 1 can stably hold data when the collector current Ic flowing through the bit line BL or /BL and the drain current Id flowing through the drive transistor Q3 or Q4 and the cut transistor Q5 or Q6 satisfy the following relation:

$$Id \geq 3 \cdot Ic/(1+hFE)$$

When the power supply voltage Vcc is equal to 1.8 V, the collector current Ic is equal to 100 $\mu$A and the current amplification factor hFE is equal to 10, for example, the drain current Id is supplied as follows:

$$Id \geq 3 \cdot 100\mu A/(10+1) = 27\mu A$$

When the drive transistors Q1 and Q2 have current drivability for feeding the drain current Id of 27 $\mu$A under the power supply voltage Vcc of 1.8 V, therefore, the memory cell 1 can stably hold data. Even if the read load circuit 10 supplies a relatively high current in order to quickly increase the voltage of the bit line BL or /BL, the base current flowing through the bipolar transistor BP1 or BP2 can be sufficiently reduced so that the memory cell 1 can reliably hold data.

In the data reading, a relatively large current flows to the bit line BL or /BL connected with the bipolar transistor BP1 or BP2 receiving low-level data at its base electrode node. When the read load circuit 10 contains a latch circuit for bringing the MOS transistors 10b and 10c for current supply into non-conducting states when the bit line potentials increase beyond the prescribed voltage VL level, the collector current can be fed only for a prescribed period in the data reading period for reducing current consumption in reading.

According to the structure shown in FIG. 1, as hereinabove described, currents flow only in a selected column (bit line pair) and non-selected bit line pairs are held at low levels in data writing and reading. Even if a word line is driven into a selected state in a single memory block, therefore, column currents do not flow in all bit line pairs intersecting with the selected word line, and current consumption can be remarkably reduced.

Figure 4:
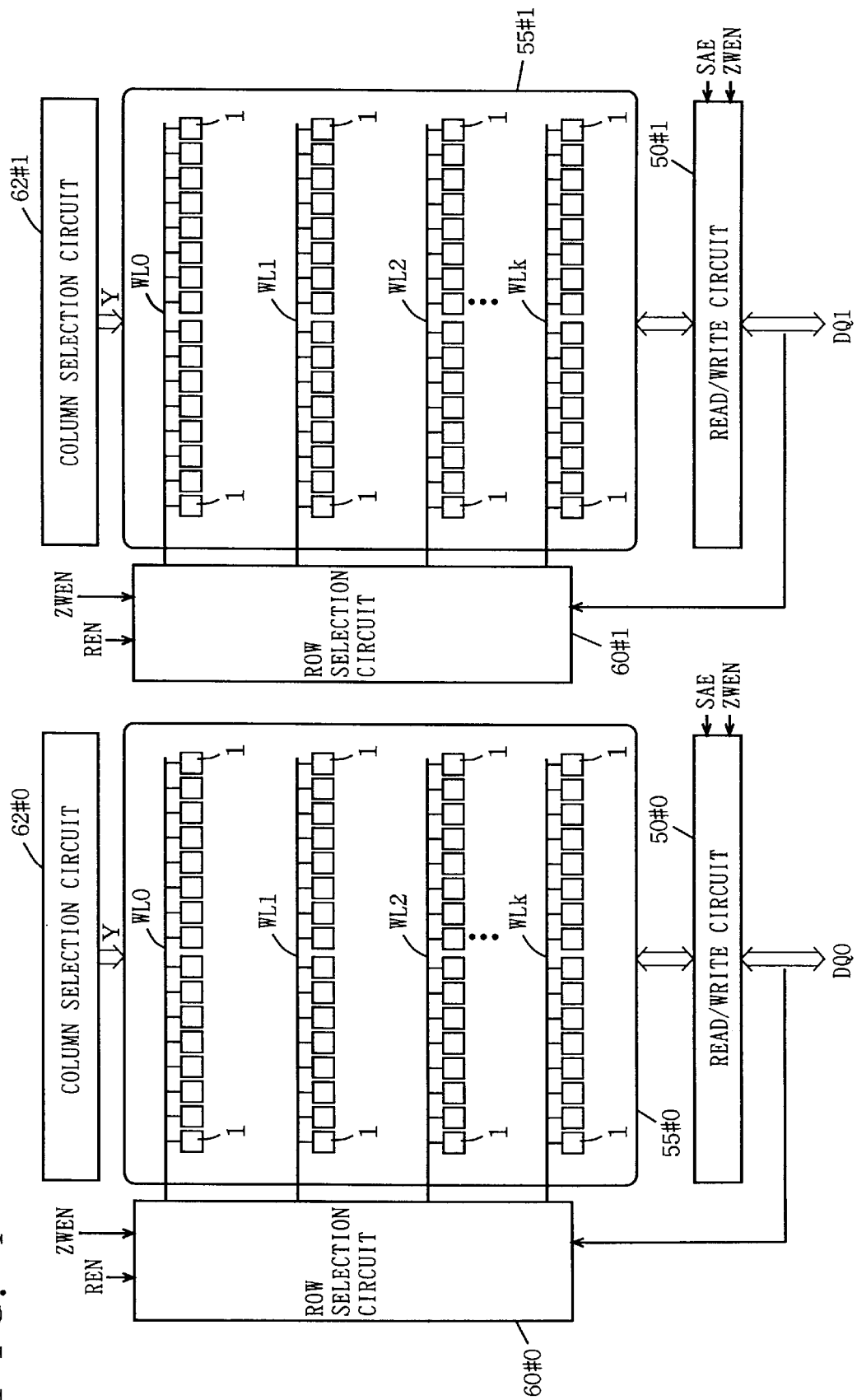
FIG. 4 schematically illustrates the overall structure of the static semiconductor memory device according to the embodiment 1 of the present invention.

FIG. 4 schematically illustrates the overall structure of the static semiconductor memory device according to the embodiment 1 of the present invention. This figure shows an exemplary structure of the static semiconductor memory device inputting/outputting 2-bit data DQ0 and DQ1.

Referring to FIG. 4, the static semiconductor memory device includes memory blocks 55#0 and 55#1 provided in correspondence to the data bits DQ0 and DQ1 respectively. Each of the memory blocks 55#0 and 55#1 includes memory cells 1 arranged in rows and columns, and a plurality of word lines WL0 to WLk arranged in correspondence to the respective rows of the memory cells 1 to be connected with the memory cells 1 of the corresponding rows respectively. Each of the word lines WL0 to WLk includes subword lines WLU and WLL, as shown in FIG. 1.

Row selection circuits 60#0 and 60#1 for driving a row in the corresponding memory blocks 55#0 and 55#1 into a selected state in accordance with an address signal (not shown) and column selection circuits 62#0 and 62#1 for generating column selection signals Y selecting a column in the corresponding memory blocks 55#0 and 55#1 in accordance with an address signal (not shown) are provided in correspondence to the memory blocks 55#0 and 55#1 respectively. Due to the provision of the row selection circuits 60#0 and 60#1 for the respective memory blocks 55#0 and 55#1, the word lines WL0 to WLk provided in the memory blocks 55#0 and 55#1 can be driven into selected states independently of each other. In other words, the word lines WL0 to WLk included in the memory block 55#0 are electrically isolated from those included in the memory block 55#1. In each of the memory blocks 55#0 and 55#1, a single word line is driven into a selected state in accordance with the corresponding one of row selection circuits 60#0 to 60#1. However, the current flows to the bit lines BL and /BL in only a selected column as described above with reference to FIG. 1, and hence the bit line current flows only in a single column in each of memory blocks 55#0 and 55#1 in data reading/writing even if the memory blocks 55#0 and 55#1 are provided in correspondence to the data bits DQ0 and DQ1 respectively and the lengths of the word lines WL0 to WLk are increased, and current consumption can be reduced.

Further, read/write circuits 50#0 and 50#1 are provided in correspondence to the memory blocks 55#0 and 55#1 respectively. These read/write circuits 50#0 and 50#1 include sense amplifiers, bit line potential driving circuits in writing and write drivers for generating internal write data.

The row selection circuits 60#0 and 60#1 include circuits for setting the word line potentials in response to write data in data writing. Arrows directed from the read/write circuits 50#0 and 50#1 to the row selection circuits 60#0 and 60#1 show such paths. Therefore, a single sense amplifier, a single write circuit and a single write driving circuit may be provided for each of the memory blocks 55#0 and 55#1, and the areas occupied by the sense amplifiers and the write driving circuits can be reduced dissimilarly to a structure of a single memory block corresponding to a plurality of data bits.

When a word line and a bit line pair are selected in each of the memory blocks 55#0 and 55#1, data is inputted /outputted from a corresponding data input/output node in each block. Therefore, no block selection signal is required for selecting the memory block 55#0 or 55#1 and connecting the selected one to the data input/output node, whereby an interconnection occupying area can be reduced.

The read activation signal RED and a write activation signal ZWEN are supplied to each of the row selection circuits 60#0 and 60#1 with the write data since driving potentials for the subword lines WLU and WLL included in each of the word lines WL0 to WLk are different from each other in data writing/reading. Each of the read/write circuits 50#0 and 50#1 is also supplied with the read activation signal REN and the write activation signal ZWEN. Each of the read/write circuits 50#0 and 50#1 is set in a data read mode in activation of the read activation signal REN, and set in a data write mode in activation of the write activation signal ZWEN. The structure of each part is now described.

Figure 5:
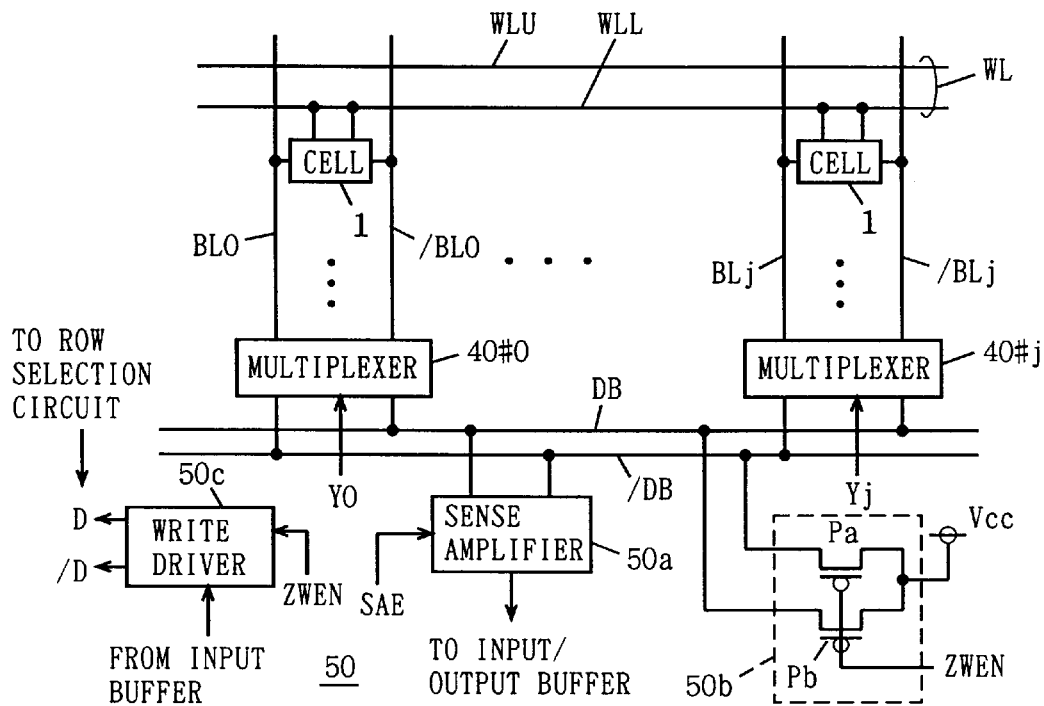
FIG. 5 schematically illustrates an exemplary structure of a read/write circuit shown in FIG. 1.

FIG. 5 shows an exemplary structure of the read/write circuit 50 shown in FIGS. 1 and 4. This figure shows the structure of the read/write circuit 50 provided for a single memory block. This read/write circuit 50 includes local data bus lines DB and /DB arranged in common for bit line pairs BL0 and /BL0 to BLj and /BLj of the corresponding memory block, a sense amplifier 50a activated in activation of the read activation signal REN for differentially amplifying signal potentials on the local data bus lines DB and /DB for transmission to an input/output buffer (not shown), a write circuit 50b activated in activation of the write activation signal ZWEN for transmitting a signal of the power supply voltage Vcc level to the local data bus lines DB and /DB, and a write driver 50c generating internal write data D and /D in accordance with write data from an input buffer in activation of the write activation signal ZWEN. The write circuit 50b includes p-channel MOS transistors Pa and Pb conducting in response to the write activation signal ZWEN, for transmitting the power supply voltage Vcc to the local data bus lines DB and /DB.

The local data bus lines DB and /DB are arranged only in the corresponding memory block. Any one of multiplexers 40#0 to 40#j provided for the bit line pairs BL0 and /BL0 to BLj to /BLj conducts in accordance with activation of any one of column selection signals Y0 to Yj from the column selection circuit (not shown) for connecting the bit line pair corresponding to the selected column to the local data bus lines DB and /DB.

FIG. 5 representatively shows a row of memory cells 1 and a word line WL (subword lines WLU and WLL) connected with these memory cells 1.

In the structure shown in FIG. 5, the bit line pair provided in correspondence to the selected column is connected to the local data bus lines DB and /DB through the multiplexer conducting in response to the column selection signal. In the data reading, the read activation signal REN is activated and the sense amplifier 50a is activated to differentially amplify the signal potentials on the local data bus lines DB and /DB. In data writing, on the other hand, the write activation signal ZWEN is activated and the write circuit 50b transmits a signal of the power supply voltage Vcc level onto the local data bus lines DB and /DB. Thus, only the bit lines provided for the selected column are driven into the high level in the data writing.

As shown in FIG. 5, only a single sense amplifier 50a is provided for a single memory block. Therefore, the number of necessary sense amplifiers 50a is identical to that of the data bits DQ0 and DQ1, i.e., the memory blocks 55#0 and 55#1, and the occupied areas thereby can be reduced. Each write circuit 50b transmits a high-level signal to the local data bus lines DB and /DB regardless of the write data. Thus, the write circuit 50b is substantially a precharge circuit, and requires current drivability substantially identical to the collector current of each bipolar transistor included in each memory cell 1 (the former must be slightly higher than the latter due to the necessity of driving the local data bus lines DB and /DB). Therefore, the occupied area thereby is also relatively small and only a single write circuit 50b is provided for each memory block, whereby increase of the chip area can be suppressed. Further, only a single write driver 50c is provided for each memory block too, reducing the occupied area.

Figure 6:
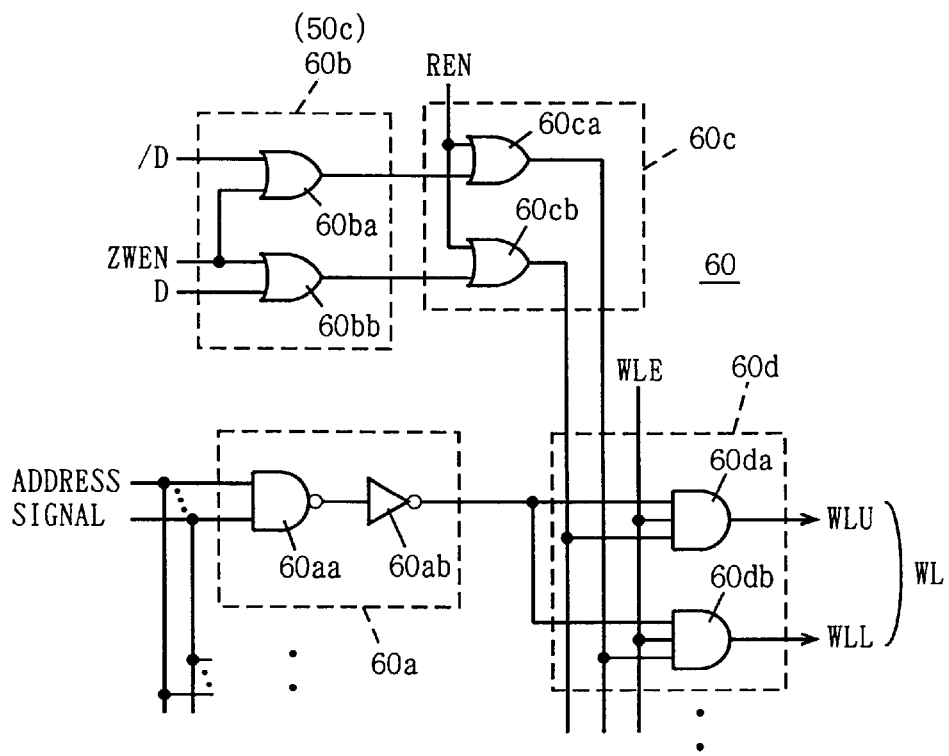
FIG. 6 schematically illustrates an exemplary structure of a row selection circuit shown in FIG. 4.

FIG. 6 illustrates an exemplary structure of each of the row selection circuits 60#0 and 60#1 shown in FIG. 4. This figure shows the structure of a part for a single word line WL in a single memory block 55#0 or 55#1. Referring to FIG. 6, this row selection circuit 60 includes a row decode circuit 60a for decoding an externally supplied address signal (row address signal), a write word line control circuit 60b for generating a word line driving signal in accordance with internal write data D and the write activation signal ZWEN of negative logic, a word line voltage control circuit 60c for generating a word line driving signal transmitted onto the selected word line WL in accordance with the read activation signal REN of positive logic and the word line driving signal from the write word line control circuit 60b, and a word line driving circuit 60d for transmitting a word line selection signal onto the word line WL in accordance with the word line driving signal from the word line voltage control circuit 60c, the word line selection signal from the row decoder circuit 60a and a word line activation signal WLE defining a word line activation period.

The row decode circuit 60a and the word line driving circuit 60d are provided in correspondence to each word line WL, while the write word line control circuit 60b and the word line voltage control circuit 60c are provided in common for the row selection circuits 60.

The row decode circuit 60a includes a NAND circuit 60aa receiving the address signal and an inverter 60ab receiving an output signal of the NAND circuit 60aa. The inverter 60ab outputs a word line specifying signal. This inverter 60ab outputs a high-level word line specifying signal for the word line WL corresponding to the addressed row.

The write word line control circuit 60b includes an OR circuit 60ba receiving the write activation signal ZWSEN and write data /D and an OR circuit 60bb receiving the write activation signal ZWEN and the write data D. The word line voltage control circuit 60c includes an OR circuit 60ca receiving the read activation signal REN and an output signal of the OR circuit 60ba and an OR circuit 60cb receiving an output signal of the OR circuit 60bb and the read activation signal REN.

The word line driving circuit 60d includes an AND circuit 60da receiving output signals of the OR circuit 60cb and the row decode circuit 60a and the word line activation signal WLE to drive the subword line WLU and an AND circuit 60db receiving output signals of the OR circuit 60ca and the row decode circuit 60a and the word line activation signal WLE to drive the subword line WLL.

The write activation signal ZWEN is driven into a low level of an active state for a prescribed period in data writing. The read activation signal REN is brought into an active state of a high level for a prescribed period in data reading. In data reading, therefore, the subword lines WLU and WLL of the selected word line WL are driven into high levels. In data writing, on the other hand, the subword line WLU is driven into a high level and the subword line WLL is held at a low level in the selected word line WL. When the write data D is at a low level, the subword line WLL is driven into a high level and the subword line WLU is held at a low level. Thus, the potential levels of the subword lines WLU and WLL can be set in response to the write data D in data writing, while the subword lines WLU and WLL of the selected word line WL can be driven into high levels in data reading.

The word line driving circuit 60d is supplied with the word line activation signal WLE, for driving the selected word line WL into an active state only while the word line activation signal WLE is in an active state. The word line activation signal WLE is driven into an active state of a high level for a prescribed period in accordance with address transition detection, as described later. Thus, the selected word line WL is driven into a selected state only for a prescribed period from the address transition.

While the write driver 50c and the write word line control circuit 60b are provided independently of each other in FIGS. 5 and 6, these elements may be combined into a single circuit.

Figure 7:
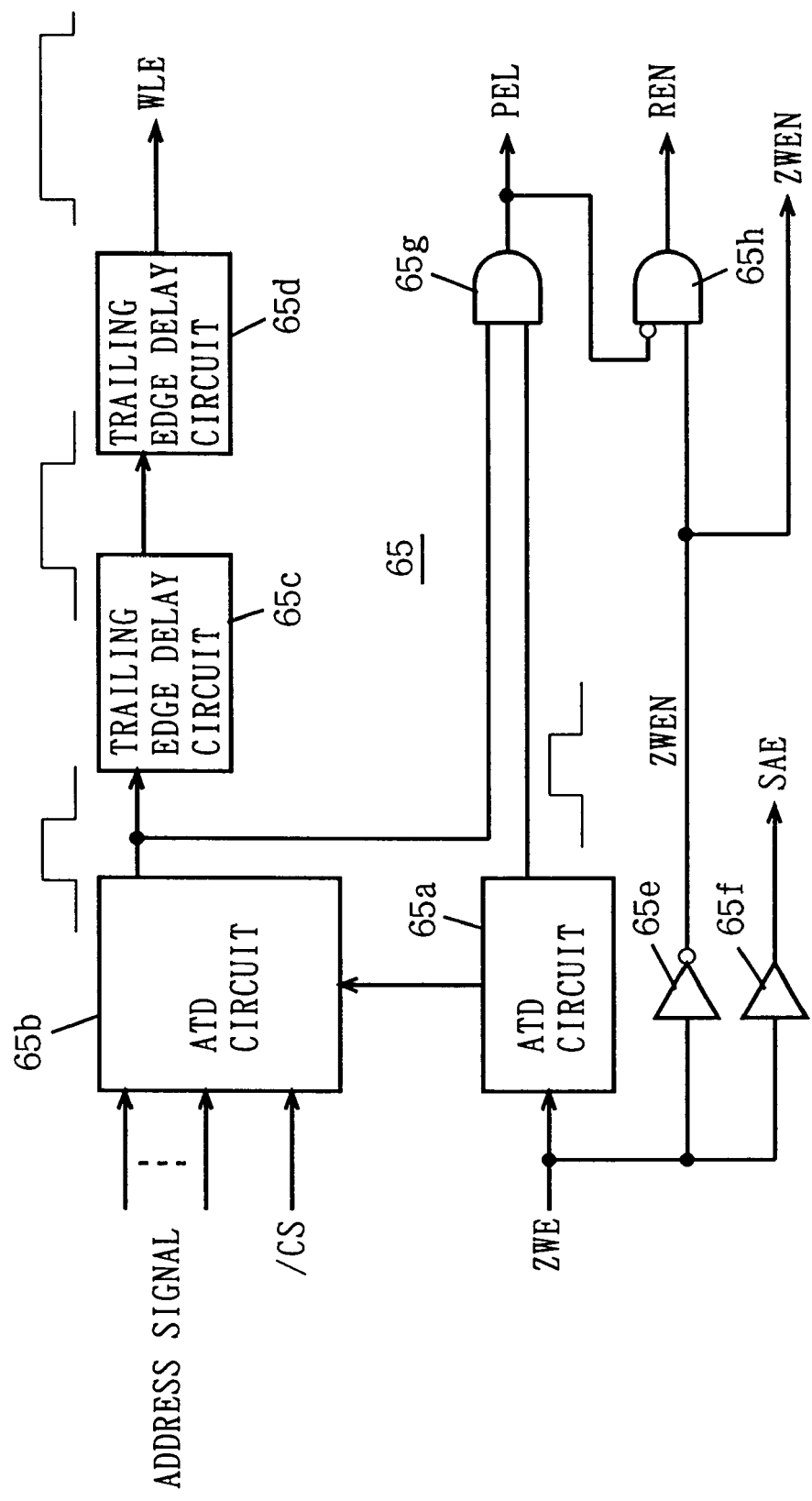
FIG. 7 schematically illustrates an exemplary structure of a circuit generating control signals shown in FIGS. 5 and 6.

FIG. 7 schematically illustrates the structure of a control signal generation part 65 for generating the respective control signals shown in FIGS. 1, 5 and 6. The control signal generation part 65 shown in FIG. 7 supplies to a plurality of memory blocks control signals generated in common.

Referring to FIG. 7, the control signal generation part 65 includes an ATD circuit 65a for detecting a transition point of an externally supplied write enable signal ZWE and an ATD circuit 65b activated in activation of an external chip select signal /CS for detecting a transition point of an externally supplied address signal. The ATD circuit 65b combines (ORs) a one-shot pulse signal from the ATD circuit 65a with a one-shot pulse signal generated in detection of address transition and outputs the result as a transition detection signal. FIG. 7 illustrates a pulse signal rising to a high level in activation as an exemplary transition detection signal.

The control signal generation part 65 further includes a trailing edge delay circuit 65c for delaying only the trailing edge of the pulse signal outputted from the ATD circuit 65b, and another trailing edge delay circuit 65d further delaying the trailing edge of the pulse signal from the trailing edge delay circuit 65c. The trailing edge delay circuit 65d outputs the word line activation signal WLE having a prescribed time width. This word line activation signal WLE is supplied to the word line driving circuit 60d for deciding the internal word line selection/activation period as shown in FIG. 6, and the respective control signals are generated based on the word line activation signal WLE.

The trailing edge delay circuits 65c and 65d simply delay the trailing edge of the supplied pulse signal. These two stages of trailing edge delay circuits 65c and 65d are employed in order to reliably generate the word line activation signal WLE having a sufficient pulse width. The word line activation signal WLE may be supplied to the row decode circuit 60a shown in FIG. 6. Further, the word line activation signal WLE may be supplied to the column selection circuit for deciding its operating time.

The control signal generation part 65 further includes an AND circuit 65g receiving the output signals from the ATD circuits 65a and 65b, an inverter 65e for receiving the external write enable signal ZWE and outputting the write activation signal ZWEN, a buffer circuit 65f for receiving the external write enable signal WZE and outputting the sense amplifier activation signal SAE, and a gate circuit 65h for receiving the write activation signal ZWEN outputted from the inverter 65e and the bit line precharge instruction signal PEL outputted from the AND circuit 65g.

The gate circuit 65h drives the read activation signal REN outputted therefrom into an active state of a high level when the bit line precharge instruction signal PEL is in an inactive state of a low level and the write activation signal ZWEN is in an inactive state of a high level for indicating data reading. In data reading, therefore, the read activation signal REN is driven into an active state after a bit line precharge operation is completed.

On the other hand, the sense amplifier activation signal SAE is brought into an active state when the external write enable signal ZWE is in an inactive state of a high level.

The bit line precharge instruction signal PEL enters an active state when both output signals of the ATD circuits 65a and 65b are at high levels. When the address signal as well as the write enable signal ZWE change to specify reading or writing, the bit line precharge instruction signal PEL is activated for precharging the bit lines BL and /BL to a prescribed low voltage level.

In the structure of arranging the memory blocks 55#0 and 55#1 for the data bits DQ0 and DQ1 respectively and selecting a 1-bit memory cell in each of the memory blocks 55#0 and 55#1 as shown in FIG. 7, no block selection signal may be generated. The control signal generation circuit 65 may simply supply the control signals to the respective memory blocks 55#0 and 55#1 in common, whereby the interconnection layout is simplified. Further, any logic needs not be taken between the block selection signal and the control signals from the control signal generation circuit 65, whereby the interconnection layout is simplified and the interconnection line occupying area is reduced.

Modification

Figure 8:
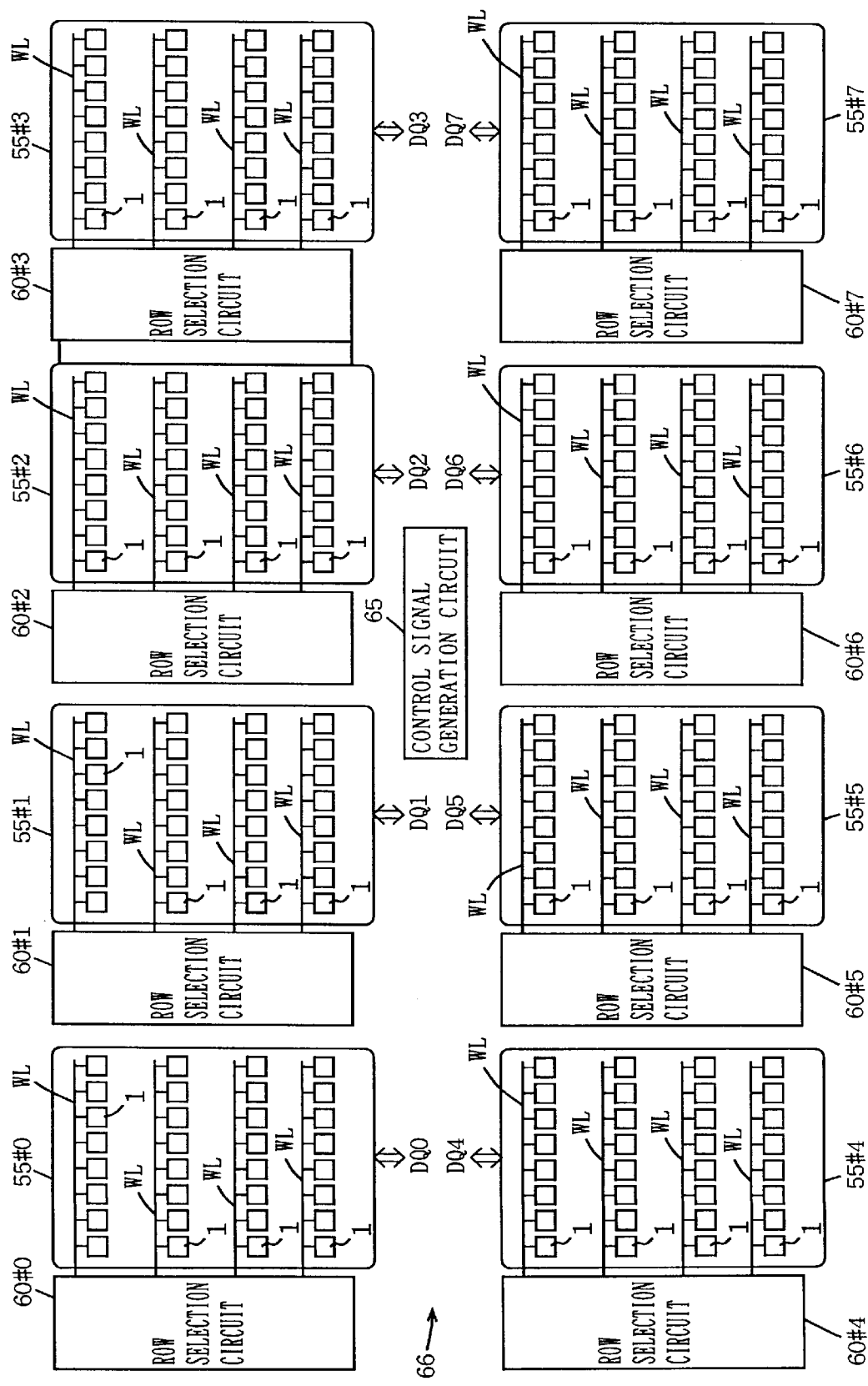
FIG. 8 schematically illustrates the overall structure of a modification of the static semiconductor memory device according to the embodiment 1 of the present invention.

FIG. 8 schematically illustrates the array of a static semiconductor memory device according to a modification of the embodiment 1 of the present invention. This figure illustrates the array structure of a static semiconductor memory device for inputting/outputting 8-bit data DQ0 to DQ7. Referring to FIG. 8, this static semiconductor memory device includes memory blocks 55#0 to 55#7 provided in correspondence to the data bits DQ0 to DQ7 respectively, and row selection circuits 60#0 to 60#7 provided in correspondence to the memory blocks 55#0 to 55#7 respectively for receiving an internal row address signal from an address buffer (not shown) in common and driving rows in the corresponding memory blocks 55#0 to 55#7 into selected states.

In each of the memory blocks 55#0 to 55#7, memory cells 1 are arranged in rows and columns and word lines WL (WLU and WLL) are arranged in correspondence to the respective rows. The word lines WL extend only in each memory block, and are electrically isolated from those of the any other memory blocks.

The row selection circuits 60#0 to 60#7 provided in correspondence to the memory blocks 55#0 to 55#7 select the word lines WL in units of the memory blocks 55#0 to 55#7. A 1-bit memory cell 1 is selected in each of the memory blocks 55#0 to 55#7, for reading/writing data. The memory blocks 55#0 to 55#7 are arranged independently of each other in correspondence to the data bits DQ0 to DQ7 respectively. Thus, it is possible to readily cope with increase of the data bit number by increasing the number of the memory blocks.

The memory blocks 55#0 to 55#3 are aligned with each other in a row direction, while the memory blocks 55#4 to 55#7 are aligned with each other in the row direction. A control signal generation circuit 65 is arranged on a central part of a central region 66 between the memory blocks 55#0 to 55#3 and the memory blocks 55#4 to 55#7. This control signal generation circuit 65 has a structure similar to that of the control signal generation circuit 65 shown in FIG. 7, and generates internal control signals for the memory blocks 55#0 to 55#7 respectively. Due to the arrangement of the control signal generation circuit 65 on the central part, propagation paths for the internal control signals can be symmetrized for simplifying the layout of interconnection layout.

Further, the word lines WL are driven into selected states in units of the memory blocks 55#0 to 55#7, and data read/written from/in a 1-bit memory cell 1 in each memory block. Therefore, a sense amplifier (not shown) and a data write circuit (write word line control circuit) (not shown) may be provided for each of the memory blocks 55#0 to 55#7 and the number of circuit parts required for reading/ writing is identical to that of the data bits DQ0 to DQ7, i.e., that of the memory blocks 55#0 to 55#07, whereby the area occupied by the read/write circuits can be reduced. In addition, the array layout can be implemented by repetitively arranging a plurality of memory blocks having the same layout by the structure of independently (individually) driving the word lines WL of the memory blocks 55#0 to 55#7. The aforementioned advantages in layout can be attained by the structure of driving the word lines WL of the memory blocks 55#0 to 55#7 by the corresponding row selection circuits 60#0 to 60#7 independently of each other.

First Arrangement of Data Input/Output Pad

Figure 9:
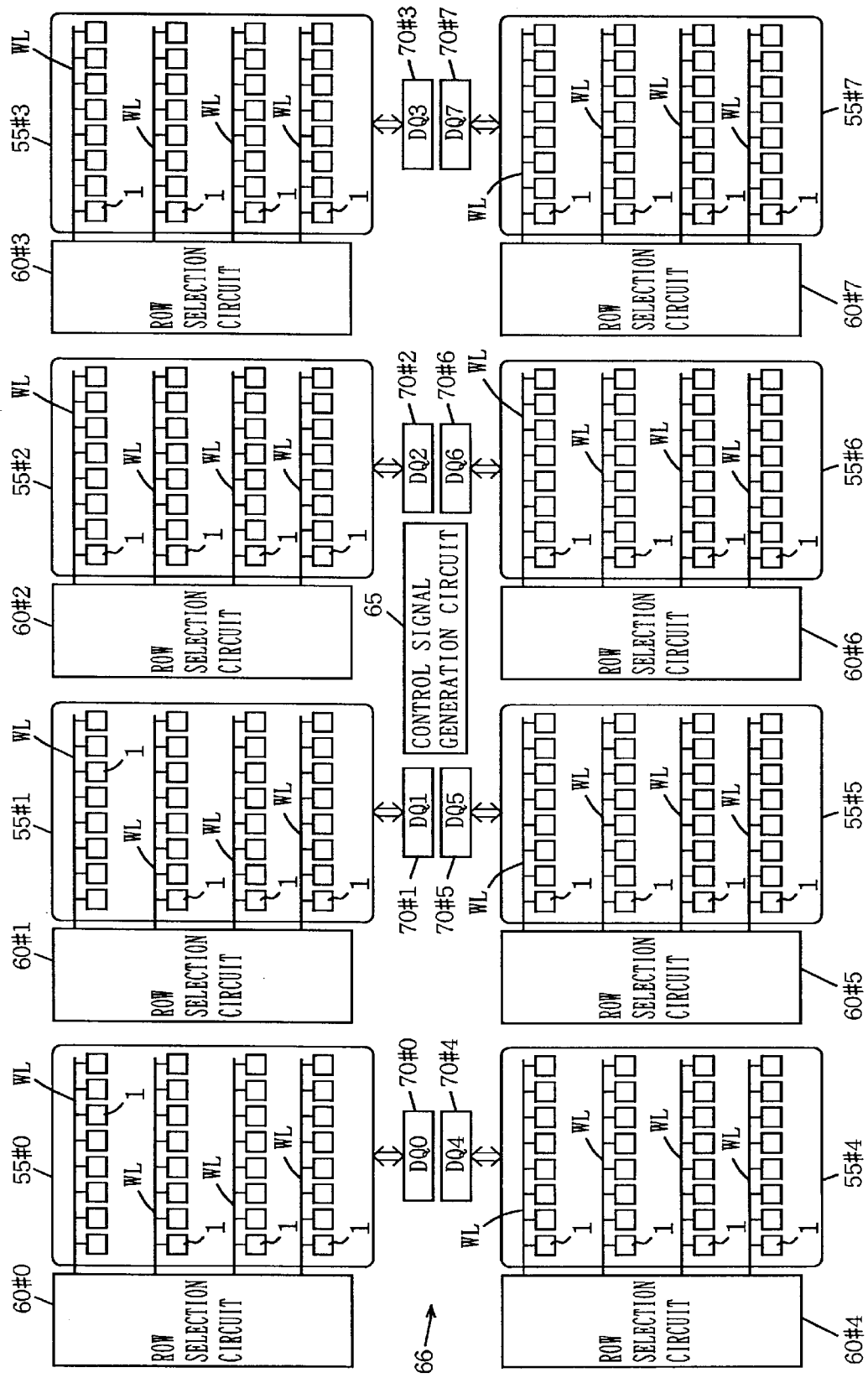
FIG. 9 schematically illustrates an exemplary arrangement of data input/output pads of the static semiconductor memory device according to the embodiment 1 of the present invention.

FIG. 9 schematically illustrates a first arrangement of data input/output pads in the static semiconductor memory device according to the embodiment 1 of the present invention. Referring to FIG. 9, DQ pad parts 70#0 to 70#7 are arranged on the central region 66 in correspondence to the memory blocks 55#0 to 55#7 respectively. Each of the DQ pad parts 70#0 to 70#7 includes a pad (DQ pad) connected to a pin terminal and a data buffer for inputting/outputting data.

The DQ pad parts 70#0 to 70#7 are arranged on the central region 66 in correspondence to the memory blocks 55#0 to 55#7 respectively, whereby data transmission lines between the DQ pad parts 70#0 to 70#7 and the corresponding memory blocks 55#0 to 55#7 are so reduced in length that the data can be inputted/outputted at a high speed. Further, control signal input pads are arranged in proximity to the control signal generation circuit 65, which in turn can generate the internal control signals in accordance with an external control signal at a high speed. The pad arrangement having pads arranged in a chip central region is generally known as "LOC (lead on chip)" arrangement. The word lines WL of the memory blocks 55#0 to 55#7 are driven into selected states independently of each other with the same address signal for inputting/outputting data in/from a 1-bit memory cell 1 in each memory block, whereby the DQ pad parts 70#0 to 70#7 can be arranged in correspondence to the memory blocks 55#0 to 55#7 respectively to readily cope with the LOC pad arrangement.

Second Arrangement of Data Input/Output Pad

Figure 10:
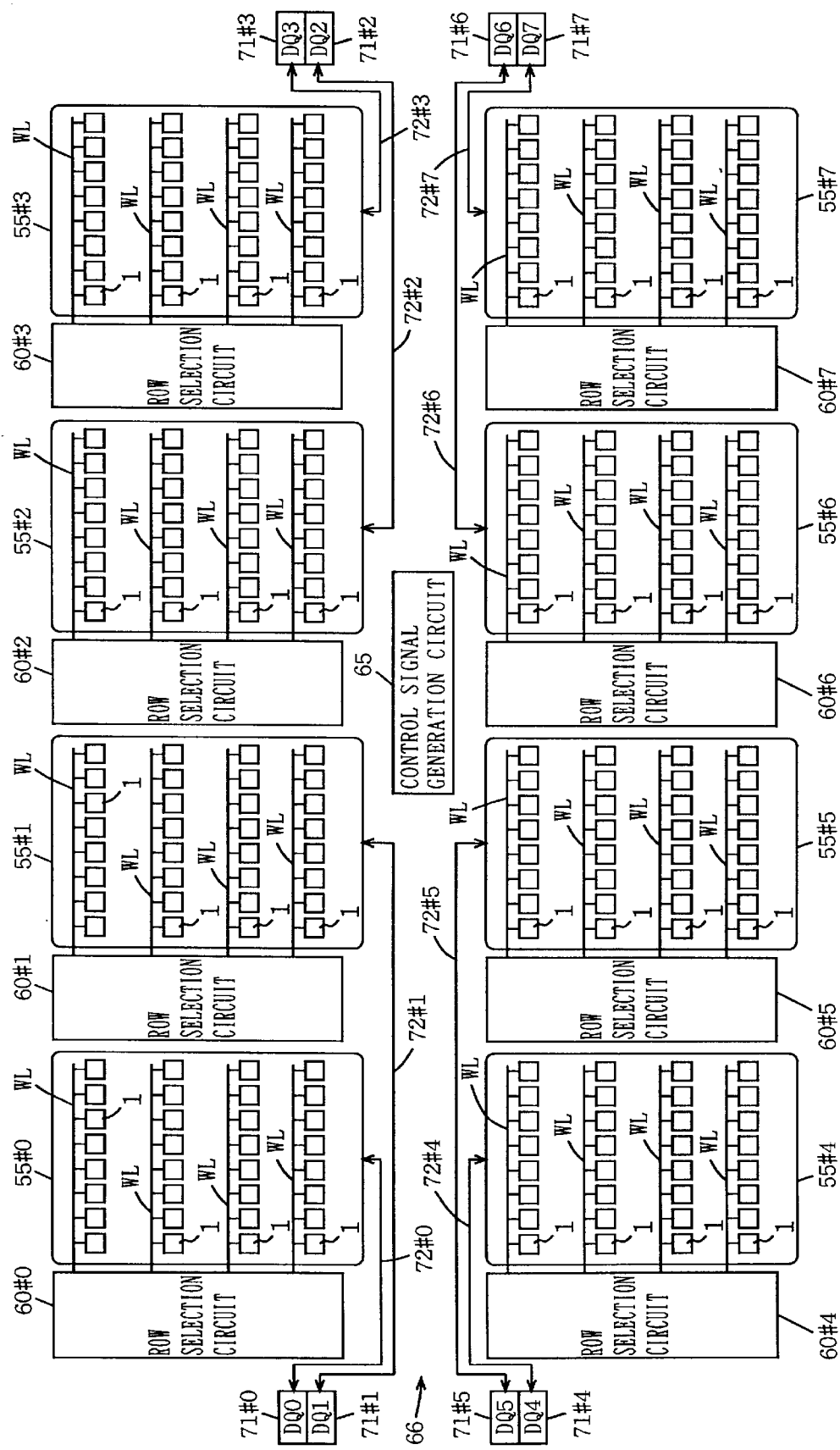
FIG. 10 schematically illustrates a second exemplary arrangement of data input/output pads of the static semiconductor memory device according to the embodiment 1 of the present invention.

FIG. 10 illustrates a second arrangement of data input/ output pads in the static semiconductor memory device according to the embodiment 1 of the present invention. Referring to FIG. 10, DQ pad parts 71#0 to 71#7 are arranged on both sides of the central region 66 between the memory blocks 55#0 to 55#3 and the memory blocks 55#4 to 55#7. Namely, the DQ pad parts 71#0 and 71#1 are arranged adjacently to the row selection circuit 60#0 and the DQ pad parts 71#4 and 71#5 are arranged adjacently to the row selection circuit 60#4 on the left outer peripheral portion of the central region 66.

On the opposite outer peripheral portion of the central region 66, the DQ pad parts 71#2 and 71#3 are arranged adjacently to the memory block 55#3 and the DQ pad parts 71#6 and 71#7 are arranged adjacently to the memory block 55#7. These DQ pad parts 71#0 to 71#7 input/output the data bits DQ0 to DQ7 respectively. The DQ pad parts 71#0 to 71#7 are electrically coupled to the corresponding memory blocks 55#0 to 55#7 respectively through common data bus lines 72#0 to 72#7 arranged on the central region 66. The remaining arrangement is identical to the layout arrangement shown in FIG. 9.

The pad arrangement shown in FIG. 10 is called "peripheral pad" arrangement, which is employed in case of arranging pin terminals along the periphery of a semiconductor chip. The memory blocks 55#0 to 55#7 are arranged in one-to-one-correspondence to the data bits DQ0 to DQ7 respectively also in such a peripheral pad arrangement. Thus, it is possible to readily cope with the peripheral pad arrangement by simply changing the positions of the DQ pad parts 71#0 to 71#7 and the layout of the internal data bus lines 72#0 to 72#7.

Third Arrangement of Data Input/Output Pad

Figure 11:
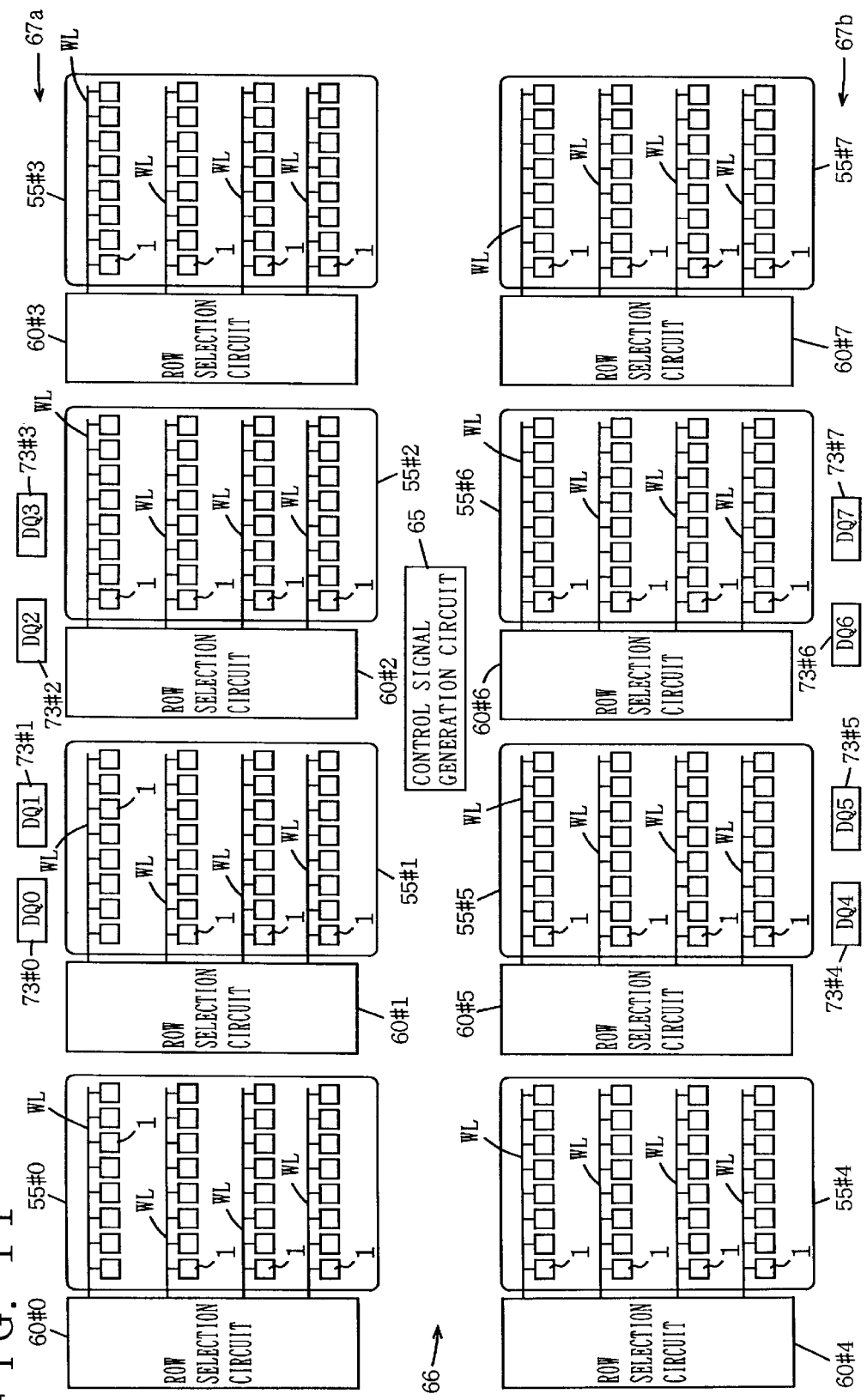
FIG. 11 schematically illustrates a third exemplary arrangement of data input/output pads of the static semiconductor memory device according to the embodiment 1 of the present invention.

FIG. 11 schematically illustrates a third arrangement of data input/output pads in the static semiconductor memory device according to the embodiment 1 of the present invention. In the arrangement shown in FIG. 11, DQ pad parts 73#0 to 73#3 and 73#4 to 73#7 are arranged on chip peripheral parts 67a and 67b opposed with respect to the central region 66 respectively. Namely, the DQ pad parts 73#0 to 73#3 are arranged on the chip peripheral part 67a opposed to the central region 66 with respect to the memory blocks 55#0 to 55#3 while the DQ pad parts 73#4 to 73#7 are arranged on the peripheral part 67b opposed to the central region 66 with respect to the memory blocks 55#4 to 55#7 respectively. These DQ pad parts 73#0 to 73#7 input/output the data bits DQ0 to DQ7 respectively. The DQ pad parts 73#0 to 73#7 are in one-to-one correspondence to the memory blocks 55#0 to 55#7 respectively, although transmission paths therefor are not clearly shown in FIG. 11.

Also in the peripheral pad arrangement shown in FIG. 11, the memory blocks 55#0 to 55#7 are arranged similarly to those shown in FIGS. 9 and 10. However, the layout of internal common data bus lines connecting the memory blocks 55#0 to 55#7 with the corresponding DQ pad parts 73#0 to 73#7 is different from that shown in FIG. 9 or 10 depending on where the column selection circuits 60#0 to 60#7 are provided for the memory blocks 55#0 to 55#7.

As shown in FIG. 9, 10 or 11, the word lines WL are individually driven into selected states in the respective memory blocks 55#0 to 55#7 and the memory blocks 55#0 to 55#7 are in one-to-one correspondence to the data input/output bits. Thus, it is possible to readily cope with either the LOC arrangement or the peripheral pad arrangement without changing the arrangement of the memory blocks 55#0 to 55#7, and a plurality types of packages can be coped with using a single array layout on a single chip.

According to the embodiment 1 of the present invention, as hereinabove described, the word lines are individually driven into selected states independently of each other in units of the memory blocks and the memory blocks are in one-to-one correspondence to the data bits, whereby it is sufficient to provide a single circuit part for reading/writing data for each memory block and the circuit occupying area can be reduced. Due to the memory cell structure employing both the bipolar transistors and the MOS transistors, further, the current flows to the bit lines only of the selected column in each memory block, whereby current consumption can be remarkably reduced.

Further, the memory blocks are in one-to-one correspondence to the data bits respectively, whereby it is possible to flexibly cope with any DQ pad arrangement without significantly changing the layout of the memory blocks.

In addition, a 1-bit memory cell is selected in each memory block, whereby a memory block needs not be selectively driven into a selected state by a block selection signal, no area of interconnection lines is required for transmitting the block selection signal, and the interconnection line occupying area is reduced.

Common data bus lines are arranged between the memory blocks and the corresponding data input/output nodes. Therefore, a single common internal data bus needs not be shared by a plurality of memory blocks but only connects the corresponding memory block with the corresponding data input/output node (DQ pad part), the interconnection line length of each common internal data bus line can be reduced in response. No sense amplifiers or write drive circuits (write word line control circuits) of the remaining memory blocks are connected to a data bus, and load capacitances thereof are reduced, and internal data can be transferred at a high speed.

Embodiment 2

Figure 12:
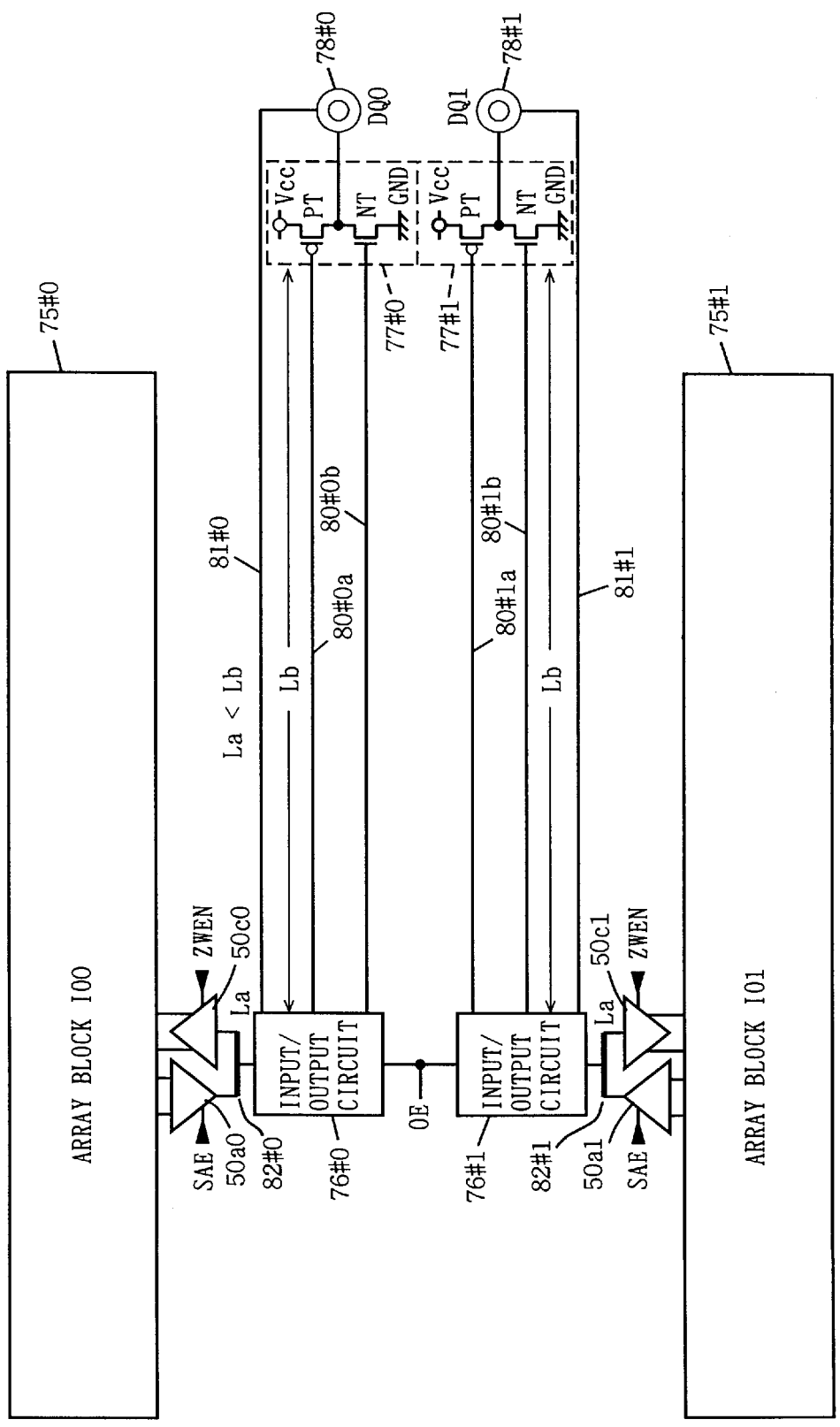
FIG. 12 schematically illustrates the structure of a principal part of a static semiconductor memory device according to an embodiment 2 of the present invention.

FIG. 12 schematically illustrates the structure of a principal part of a static semiconductor memory device according to an embodiment 2 of the present invention. Referring to FIG. 12, the static semiconductor memory device inputs/outputs 2-bit data DQ0 and DQ1, and array blocks (IO0 and IO1) 75#0 and 75#1 are provided in correspondence to the data bits DQ0 and DQ1 respectively. Each of the array blocks 75#0 and 75#1 includes memory blocks and row selection circuits similar to those in the embodiment 1.

A sense amplifier 50a 0 activated, in response to a sense amplifier activation signal SAE, for amplifying selected memory cell data of the array block 75#0 and a write driver 50c0 activated, in response to activation of a write activation signal ZWEN, for generating complementary internal data from supplied internal write data and supplying the same to a write word line control circuit included in each row selection circuit are provided for the array block (IO0) 75#0, and a sense amplifier 50a1 for amplifying selected memory cell data in response to the sense amplifier activation signal SAE and a write driver 50c1 for generating complementary internal write data from supplied internal write data in response to the write activation signal ZWEN are also provided for the array block (IO1) 75#1. The write drivers 50c0 and 50c1 may be shared with write word line control circuits.

In the structure shown in FIG. 12, an input/output circuit 76# for generating the internal write data and internal read data is arranged physically in proximity to the sense amplifier 50a0 and the write driver 50c0 for the array block 75#0, and an input/output circuit 76#1 is arranged physically in proximity to the sense amplifier 50a1 and the write driver 50c1 also for the array block (IO1) 75#1.

On the other hand, final output stages 77#0 and 77#1 for generating external data are arranged in proximity to data input/output nodes (pads) 78#0 and 78#1 respectively. These final output stages 77#0 and 77#1 have the structure of CMOS inverters formed by p-channel MOS transistors PT and n-channel MOS transistors NT, and drive the corresponding data input/output nodes 78#0 and 78#1 to a power supply voltage Vcc level or a ground voltage GND level.

The final output stage 77#0 is electrically connected to the input/output circuit 76#0 through internal read data bus lines 80#0a and 80#0b, and the input/output circuit 76#1 and the final output stage 77#1 are electrically connected with each other through internal read data bus lines 80#1a and 80#1b. The internal read data bus lines 80#0a and 80#1a are electrically connected to the gates of the p-channel MOS transistors PT included in the final output stages 77#0 and 77#1 respectively, and the internal read data bus lines 80#0b and 80#1b are electrically connected to the gates of the n-channel MOS transistors NT included in the final output stages 77#0 and 77#1 respectively.

Further, the data input/output node 78#0 is electrically connected to an input circuit included in the input/output circuit 76#0 through a signal line 81#0, and the data input/output node 78#1 is electrically connected to an input circuit included in the input/output circuit 76#1 through a signal line 81#1.

In the arrangement shown in FIG. 12, the length of an interconnection line 82#0 between the sense amplifier 50a0 and the input/output circuit 76#0 is rendered sufficiently smaller than the interconnection lengths of the read data bus lines 80#0a and 80#0b between the input/output circuit 76#0 and the final output stage 77#0, and the length of an interconnection line 82#1 between the input/output circuit 76#1 and the sense amplifier 50a1 is rendered sufficiently smaller than the interconnection lengths of the internal read data bus lines 80#1a and 80#1b between the input/output circuit 76#1 and the final output stage 77#1.

The data input/output pads 78#0 and 78#1 may be peripheral pads or pads arranged on a chip central portion in the LOC structure. It is sufficient that the interconnection line lengths between the input/output circuits 76#0 and 76#1, the sense amplifiers 50a 0 and 50a1 and the final output stages 77#0 and 77#1 satisfy such relation that the line lengths between the input/output circuits 76#0 and 76#1 and the sense amplifiers 50a 0 and 50a1 are sufficiently small as described above.

In the arrangement shown in FIG. 12, output circuits included in the input/output circuits 76#0 and 76#1 drive the internal read data bus lines 80#0a, 80#0b, 80#1a and 80#1b having the large interconnection lengths. In this case, therefore, there are signal propagation delay due to interconnection line resistance and capacitance in the internal read data bus lines 80#0a, 80#0b, 80#1a and 80#1b. The final output stages 77#0 and 77#1 are relatively slowly driven through the signal propagation delay for prevention of rapid transmission of read data to the data input/output nodes 78#0 and 78#1. Thus, generation of ringing is inhibited and "slew rate control" is implemented by the interconnection line delay.

On the other hand, the interconnection line lengths between the sense amplifiers 50a0 and 50a1 and the input/output circuits 76#0 and 76#1 are sufficiently reduced so that output signals of the sense amplifiers 50a0 to 50a1 are transmitted to the output circuits included in the input/output circuits 76#0 and 76#1 and interconnection line delay thereof can be substantially neglected. Therefore, signals once buffered need not be delayed again for the slew rate control, delay times thereof can be eliminated and high-speed access is implemented due to the implementation of the slew rate control by the interconnection line delay, and data can be stably outputted with no ringing due to the slew rate control.

The signal lines 81#0 and 81#1 electrically connect the data input/output nodes 78#0 and 78#1 directly to the input/output circuits 76#0 and 76#1. Thus, external circuits supplying data to the nodes 78#0 and 78#1 drive the signal lines 81#0 and 81#1, whereby the static semiconductor memory device needs not drive the signal lines 81#0 and 81#1 and current consumption can be reduced. Further, the input/output circuits 76#0 and 76#1 are provided in proximity to the write drivers 50c 0 and 50c1 respectively and the lengths of the interconnection lines 82#0 and 82#1 therebetween are sufficiently small, whereby internal write data can be formed at a high speed in accordance with externally supplied data to be supplied to the write drivers 50c0 and 50c1, and the internal data can be written at a high speed.

Figure 13:
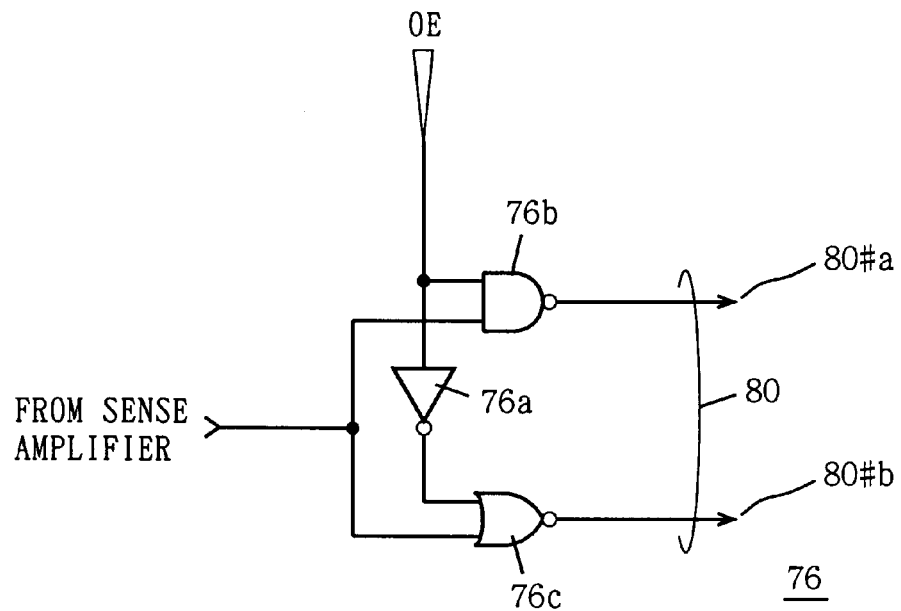
FIG. 13 illustrates an exemplary structure of an output circuit part included in an input/output circuit shown in FIG. 12.

FIG. 13 illustrates an exemplary structure of the output circuit included in the input/output circuit 76#0 or 76#1. Referring to FIG. 13, the output circuit part included in this input/output circuit 76 (76a, 76b) includes an inverter 76a receiving an output enable signal OE, a NAND circuit 76b receiving the output enable signal OE and internal data from the sense amplifier 50a0 or 50a1, and a NOR circuit 76c receiving an output signal of the inverter 76a and the internal data from the sense amplifier 50a0 or 50a1. The NAND circuit 76b transmits read data to the gate of the p-channel MOS transistor PT included in the final output stage 77#0 or 77#1 through the read data bus line 80#a (80#0a or 80#1a), and the NOR circuit 76c transmits internal read data to the gate of the n-channel MOS transistor NT included in the final output stage 77#0 or 77#1 through the internal read data bus line 80#b (80#1b or 80#0b).

In the structure of the output circuit shown in FIG. 13, the output signals of the NAND circuit 76b and the NOR circuit 76c go high and low respectively, the p-channel transistor PT and the n-channel MOS transistor NT included in the final output stage 77#0 or 77#1 enter OFF states and the final output stage 77#0 or 77#1 enters an output high-impedance state when the output enable signal OE is in an inactive state of a low level.

When the output enable signal OE enters an active state of a high level, the NAND circuit 76b and the NOR circuit 76c serve as inverters. The final output stage 77#0 or 77#1 is formed by CMOS inverters, and data corresponding to that read from the sense amplifier 50a0 or 50a1 is supplied to the data output node 78#0 or 78#1, and read data DQ0 or DQ1 is generated.

Figure 14:
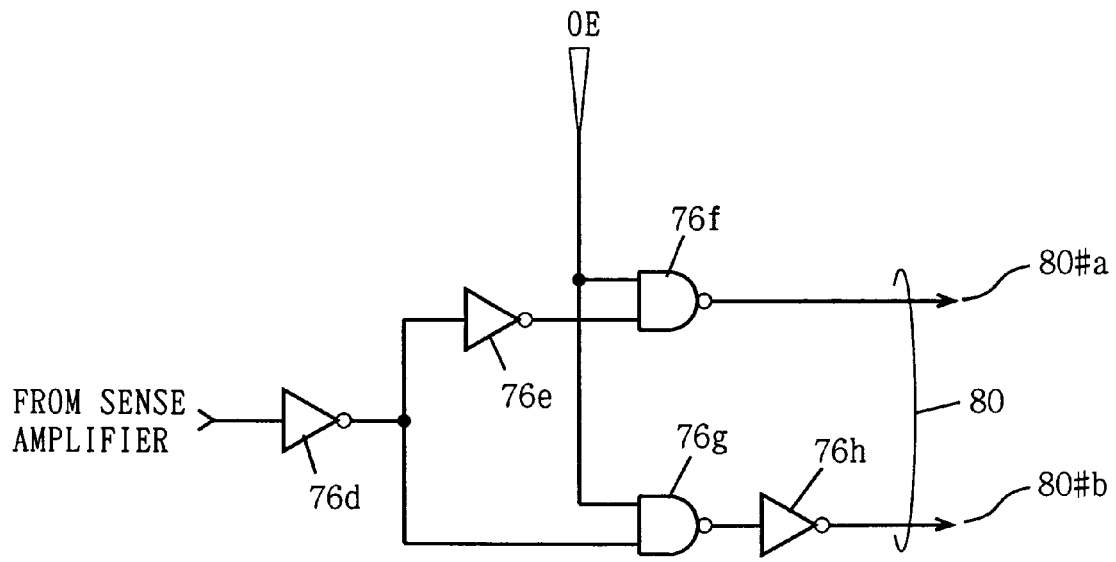
FIG. 14 illustrates another exemplary structure of the output circuit part included in the input/output circuit shown in FIG. 12.

FIG. 14 illustrates another exemplary structure of the output circuit included in the input/output circuit 76#0 or 76#1. Referring to FIG. 14, this output circuit 76 includes an inverter 76d receiving read data from the sense amplifier 50a0 or 50a1, an inverter 76e receiving an output signal of the inverter 76d, a NAND circuit 76f receiving the output enable signal OE and an output signal of the inverter 76e, a NAND circuit 76g receiving the output enable signal OE and the output signal of the inverter 76d, and an inverter 76h receiving an output signal of the NAND circuit 76g. The NAND circuit 76f drives an internal read data bus line 80#a, and the inverter 76h drives an internal read data bus line 80#b.

In the structure of the output circuit 76 shown in FIG. 14, when the output enable signal OE enters an inactive state of a low level, the output signals of the NAND circuit 76f and the inverter 76h go high and low respectively, the p-channel MOS transistor PT and the n-channel MOS transistor NT of the final output stage 77#0 or 77#1 (see FIG. 12) enter OFF states and the final output stage 77# or 77#1 enters an output high-impedance state.

When the output enable signal OE enters an active state of a high level, the NAND circuits 76f and 76g serve as inverters so that the NAND circuit 76f outputs an inverted signal of data read from the sense amplifier 50a0 or 50a1 and the inverter 76h outputs a signal of the logic corresponding to the data read from the sense amplifier 50a0 or 50a1. Therefore, when a high-level data signal is read from the sense amplifier 50a0 or 50a1, for example, the p-channel MOS transistor PT and the n-channel MOS transistor NT shown in FIG. 12 enter ON and OFF states respectively, to output a high-level data bit.

When the sense amplifier 50a0 or 50a1 outputs a low-level data signal, on the other hand, the output signals of the NAND circuit 76f and the inverter 76h go high and low respectively and the p-channel MOS transistor PT and the n-channel MOS transistor NT enter OFF and ON states respectively in the final output stage 77#0 or 77#1, to output a low-level data.

Any of the output circuits shown in FIGS. 13 and 14 may be employed. As clearly understood from FIGS. 12 to 14, the input/output circuits 76#0 and 76#1 and the final output stages 77#0 and 77#1 are formed by dividing buffer initial stage circuits and buffer final stages included in general output buffers into input/output circuits and final output stages respectively.

In general, the p-channel MOS transistors PT and the n-channel MOS transistors NT of the final output stages 77#0 and 77#1 are relatively slowly driven for preventing the data input/output nodes 78#0 and 78#1 from causing a ringing or the like. Ringing takes place when the MOS transistors PT and NT are driven at a high speed. In this case, the gate widths W of the p-channel MOS transistors PT and the n-channel MOS transistors NT are not reduced, since the value of the minimum necessary dc current is decided by a specification value or the like and the gate widths W cannot be reduced. In general, therefore, the change speed of outputs of buffer pre-stage, i.e., of the gate voltage levels of the MOS transistors PT and NT of the final output stages 77#0 and 77#1 is slowed down. Adjustment of the driving speed of the output nodes is generally called "slew rate control".

Effects attained by arranging the input/output circuits 76#0 and 76#1 in proximity to the sense amplifiers 50a0 and 50a1 respectively while arranging the final output stages 77#0 and 77#1 in proximity to the data input/output pads 78#0 and 78#1 and sufficiently increasing the interconnection line lengths between the input/output circuits 76#0 and 76#1 and the final output stages 77#0 and 77#1 are now described with reference to FIGS. 15 and 16.

Figure 15:
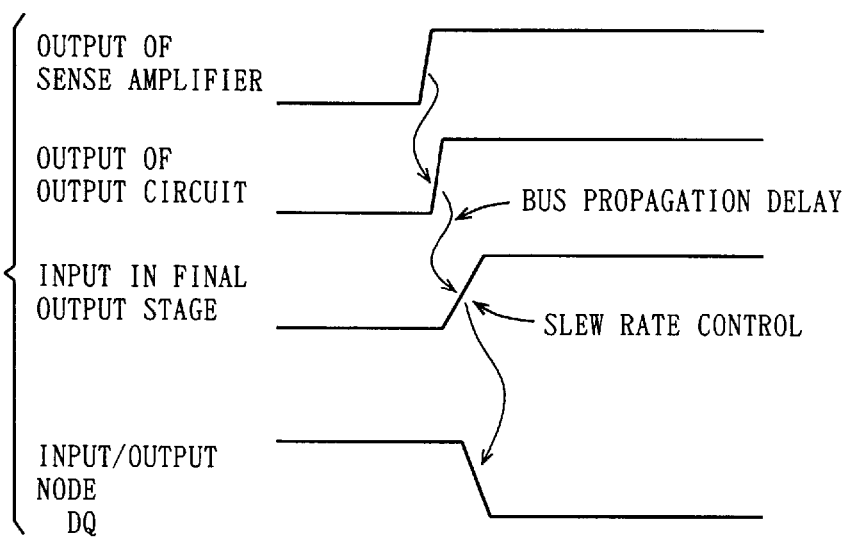
FIG. 15 is a signal waveform diagram representing an operation of the static semiconductor memory device shown in FIG. 12.

With reference to FIG. 15, a data read operation of the input/output circuit 76#0 or 76#1 arranged physically in proximity to the sense amplifier 50a0 or 50a1 as shown in FIG. 12 is described. Consider that the output signal is precharged at a low level when the sense amplifier 50a0 and 50a1 is in an inactive state. When the output signal of the sense amplifier 50a0 or 50a1 rises from the low level to a high level, this output signal is transmitted to the output circuit included in the input/output circuit 76#0 or 76#1 at a high speed since the length of the interconnection line 82#0 or 82#1 is sufficiently small. The output circuit buffers the data supplied from the sense amplifier 50a0 or 50a1, and drives the corresponding internal read data bus lines 80#0a and 80#0b or 80#1a and 80#1b. There is signal propagation delay due to presence of interconnection line resistance and interconnection line capacitance in the internal read data bus lines 80#0a and 80#0b or 80#1a and 80#1b, and the rising of the signal supplied to the input part of the final output stage 77#0 or 77#1 is slowed. The final output stage 77#0 or 77#1 have the MOS transistors PT and NT driven in accordance with the signal having the slow rising rate, to discharge the corresponding input/output node 78#0 or 78#1 to the ground voltage GND level. In this case, the signal delay by interconnection line loads of the internal read data bus lines 80#0a and 8040b or 80#1 and 80#1b implements slew rate control of adjusting the output node driving speed of the final output stage 77#0 or 77#1 and outputting a stable data signal with no ringing.

Figure 16:
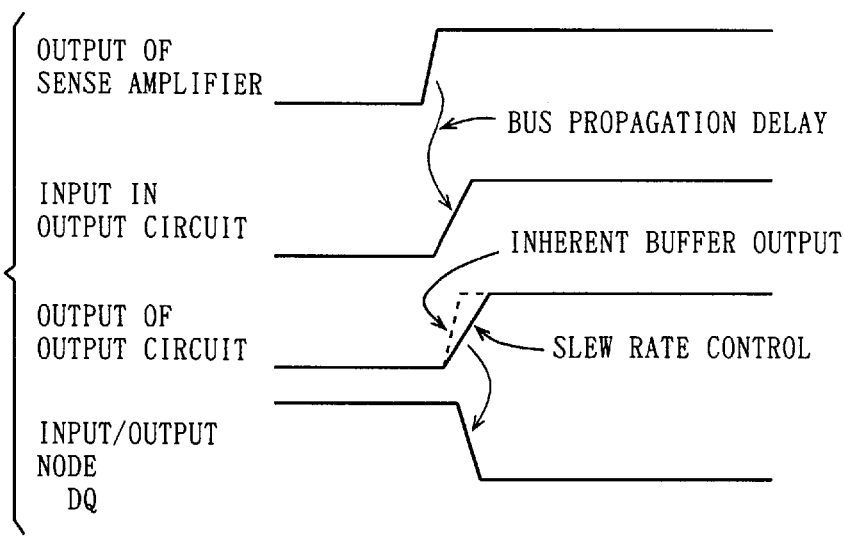
FIG. 16 schematically illustrates a data read operation of the static semiconductor memory device shown in FIG. 12 with the input/output circuit arranged in proximity to a final output stage.

Referring to FIG. 16, it is assumed that the output circuit is arranged in proximity to the final output stage 77#0 or 7741 and the distance between the sense amplifier 50a0 or 50a1 and the output circuit is substantially identical to the length of the internal read data bus lines 80#0a and 80#0b or 80#1a and 80#1b shown in FIG. 12. When the output of the sense amplifier 50a0 or 50a1 rises from a low level to a high level in this case, a signal supplied to the input part of the output circuit is delayed by this interconnection line delay, to provide a slow rising. The output circuit buffers the signal supplied to the input part thereof, and relatively slowly changes the gate voltages of the MOS transistors PT and NT of the final output stage 77#0 or 77#1 for slew rate control.

The final output stage 77#0 or 77#1 drives the input/output node 78#0 or 78#1 in accordance with the output signal from the output circuit. The output signal of the output circuit rapidly rises inherently as shown by broken lines in FIG. 16, due to the buffering of the signal supplied to the input part. The change speed of the rapidly rising buffer output is made rated for slew rate control. Due to the slew rate control of the output of the output circuit, a delay time is added again after buffering to the delay time of the signal supplied from the sense amplifier 50a0 or 50a1 to the input part of the output circuit. Thus, this results in two stages of delay. The rising waveform of the output signal from the output circuit shown by the solid line in FIG. 16 is identical to that of the input signal supplied to the input part of the final output stage 77#0 or 77#1 for slew rate control shown in FIG. 15, since the output node driving speed of the final output stage 77#0 or 77#1 is assumed to remain unchanged.

Therefore, the propagation delay from the sense amplifier 50a0 or 50a1 to the input part of the output circuit in FIG. 16 is eliminated in the arrangement shown in FIG. 15, and can be reduced by a period required for bus driving in the sense amplifier 50a0 or 50a1 and the output circuit by arranging the output circuit physically in proximity to the sense amplifier 50a0 or 50a1, to enable high-speed access.

The adjustment of the signal voltage level for slew rate control applies not only to the rise from a low level to a high level but also to fall from a high level to a low level.

The same effect can be obtained when the output signal of the sense amplifier 50a0 or 50a1 is precharged at an intermediate voltage level in an inactive state. Therefore, this output part can eliminate interconnection line delay from the sense amplifier 50a0 or 50a1 to the output circuit by arranging the output circuit corresponding to the buffer pre-stage in proximity to the sense amplifier 50a0 or 50a1 and utilizing the wiring delay caused by the output circuit when driving the internal read data bus lines 80#0a and 80#0b or 80#1a and 80#1b as a slew rate control factor.

The slew rate control is simply implemented using the interconnection line delay, no complicated processing such as adjustment of the gate width of MOS transistor in the output circuit is necessary, and the slew rate control can be readily implemented.

When the output circuit is arranged physically in proximity to the sense amplifier 50a0 or 50a1, the interconnection line length between the sense amplifier 50a0 or 50a1 and the input/output circuit 76#0 or 76#1 is reduced, no internal read data bus needs be arranged over a long distance between the sense amplifier 50a0 or 50a1 and the input/output circuit 76#0 or 76#1, no internal read data bus line of large load capacitance needs be arranged over a long distance from the sense amplifier 50a0 or 50a1 accordingly, the data signal can be transmitted from the sense amplifier 50a0 or 50a1 to the output circuit at a high speed, and high-speed access is enabled in response.

Figure 17:
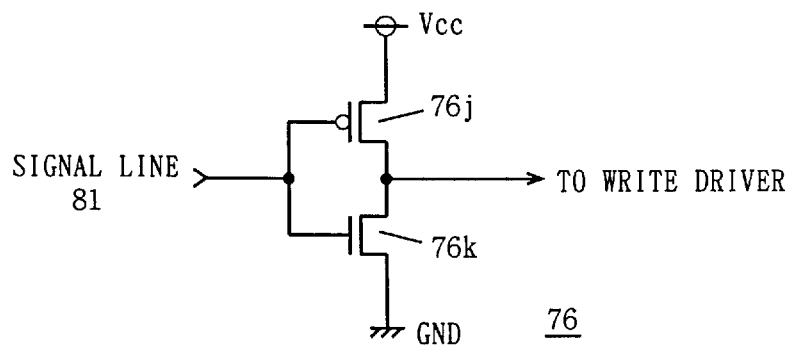
FIG. 17 illustrates an exemplary structure of an input circuit included in the input/output circuit shown in FIG. 12.

FIG. 17 schematically illustrates the structure of an input circuit included in the input/output circuit 76#0 or 76#1 shown in FIG. 12. Referring to FIG. 17, the input circuit included in this input/output circuit 76 includes an inverter of a CMOS structure for transmitting a signal on a signal line 81. This input circuit includes a p-channel MOS transistor 76j and an n-channel MOS transistor 76k. An output signal of this input circuit is transmitted to the corresponding write driver 50c0 or 50c1. The static semiconductor memory device needs not drive the signal line 81, which in turn is driven by an external device, and is simply required to drive the short interconnection line 82#0 or 82#1 up to the write driver 50c0 or 50c1, whereby internal write data can be transmitted to the write driver 50c0 or 50c1 at a high speed. The load capacitance of the write driver is small, and the signal can be transmitted at a high speed with low current consumption. When the write driver 50c0 or 50c1 is combined into a write word line control circuit, the input circuit generates complementary data.

Embodiment 3

Figure 18:
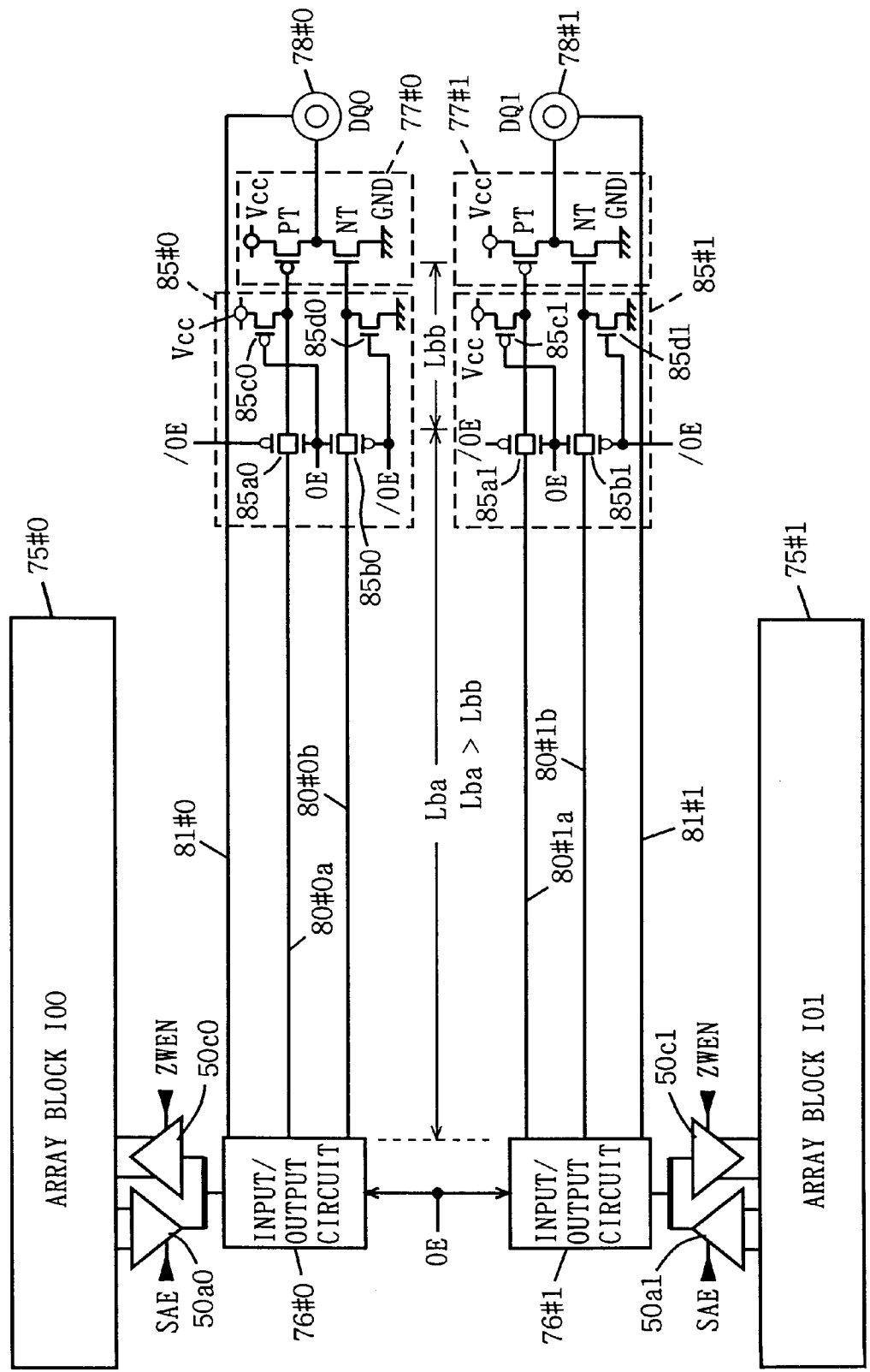
FIG. 18 schematically illustrates the structure of a principal part of a static semiconductor memory device according to an embodiment 3 of the present invention.

FIG. 18 illustrates the structure of a principal part of a static semiconductor memory device according to an embodiment 3 of the present invention. Referring to FIG. 18, array blocks (IO0 and IO1) 75#0 and 75#1 are provided in correspondence to 2-bit data DQ0 and DQ1.

The structure shown in FIG. 18 is different from that of the embodiment 2 shown in FIG. 2 in the following points. With respect to internal data transmission lines 80#0$a$ and 80#0$b$ electrically connecting an input/output circuit 76#0 with a final output stage 77#0, a reset circuit 85#0 serving as an output control circuit, which is activated in inactivation of output enable signals OE and /OE for setting the final output stage 77#0 in an output high-impedance state, is provided in proximity to the final output stage 77#0. With respect to internal data transmission lines 80#1$a$ and 80#1$b$ provided between an input/output circuit 76#1 and a final output stage 77#1, a reset circuit 85#1 serving as an output control circuit, which is activated in inactivation of the output enable signals OE and /OE for setting the final output stage 77#1 in an output high-impedance state, is provided in proximity to the final output stage 77#1. The remaining structure is identical to that shown in FIG. 12, and corresponding parts are denoted by the same reference numerals.

The reset circuit 85#0 includes CMOS transmission gates 85$a$0 and 85$b$0 entering conducting states in activation of the output enable signals OE and /OE to electrically connect the internal read data transmission lines 80#0$a$ and 80#0$b$ to the gates of MOS transistors PT and NT of the final output stage 77#0 respectively, a p-channel MOS transistor 85$c$0 which is activated in inactivation of the output enable signal OE to transmit a high-level signal of a power supply voltage Vcc level to the gate of the p-channel MOS transistor PT of the final output stage 77#0, and an n-channel MOS transistor 85$d$0 which is activated in inactivation (high level) of the output enable signal /OE to transmit a voltage of a ground voltage GND level to the gate of the n-channel MOS transistor NT of the final output stage 77#0.

The reset circuit 85#1 includes CMOS transmission gates 85$a$1 and 85$b$1 entering conducting states in activation of the output enable signals OE and /OE to electrically connect the internal read data transmission lines 80#1$a$ and 80#1$b$ to the gates of MOS transistors PT and NT included in the final output stage 77#1 respectively, a p-channel MOS transistor 85$c$1 which is activated in inactivation of the output enable signal OE to transmit a high-level signal of the power supply voltage Vcc level to the gate of the p-channel MOS transistor PT of the final output stage 77#1, and an n-channel MOS transistor 85$d$1 which is activated in inactivation of the output enable signal /OE to transmit a voltage of the ground voltage GND level to the gate of the n-channel MOS transistor NT of the final output stage 77#1. The output enable signals OE and /OE are complementary to each other.

Figure 19:
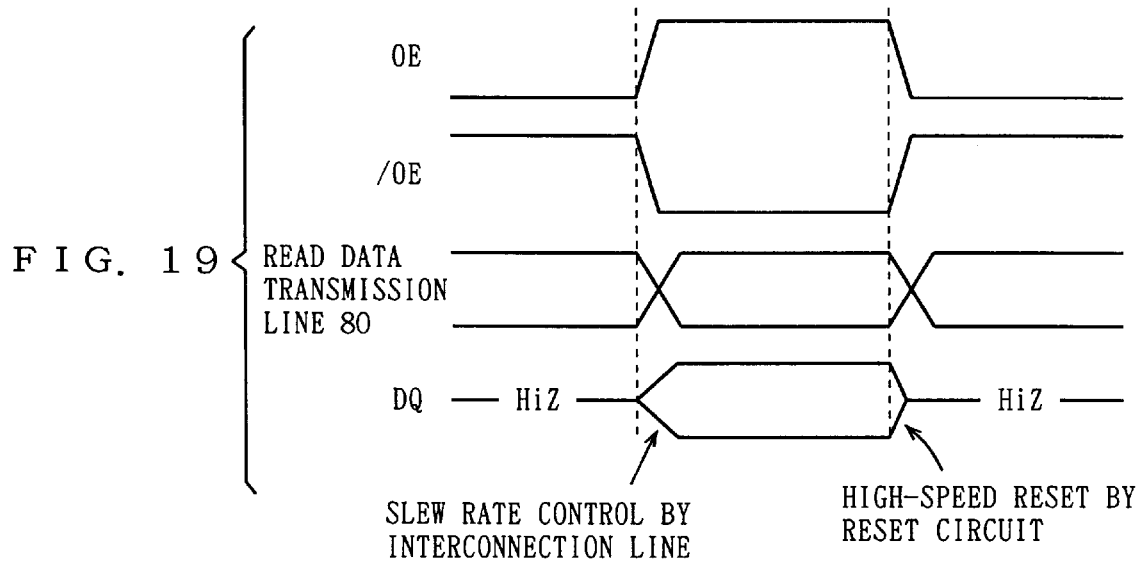
FIG. 19 is a signal waveform diagram representing an operation of the static semiconductor memory device shown in FIG. 18.

The interconnection line length L$ba$ of the internal read data transmission lines 80#0$a$ and 80#0$b$ between the input/output circuit 76#0 and the reset circuit 85#0 is rendered sufficiently longer than the distance (signal line length) L$bb$ between the CMOS transmission gates 85$a$0 and 85$b$0 included in the reset circuit 85#0 and the gates of the MOS transistors PT and NT of the final output stage 77#0. Therefore, the interconnection line capacitance between the input/output circuit 76#0 and the reset circuit 85#0 is larger than that between the reset circuit 85#0 and the final output stage 77#0. This also applies to the interconnection line capacitance between the input/output circuit 76#1 and the reset circuit 85#1 and that between the reset circuit 85#1 and the final output stage 77#1. The operation of the static semiconductor memory device shown in FIG. 18 is now described with reference to a signal waveform diagram shown in FIG. 19.

When the output enable signals OE and /OE are in inactive states of low and high levels respectively, the input/output circuit 76#0 or 76#1 outputs a signal for setting the final output stage 77#0 or 77#1 in an output high-impedance state onto the internal read data transmission lines 80#0$a$ and 80#0$b$ or 80#1$a$ and 80#1$b$. At this time, the CMOS transmission gates 85$a$0 and 85$b$0 or 85$a$1 and 85$b$1 are in OFF states in the reset circuit 85#0 or 85#1, for electrically isolating the input/output circuit 76#0 or 76#1 from the final output stage 77#0 or 77#1. In this state, therefore, the voltage level of the output signal from the input/output circuit 76#0 or 76#1 exerts no influence on the final output stage 77#0 or 77#1. In the reset circuit 85#0 or 85#1, the MOS transistors 85$c$0 and 85$d$0 or 85$c$1 and 85$d$1 enter ON states respectively to transmit a voltage of the power supply voltage Vcc level to the gate of the p-channel MOS transistor PT included in the final output stage 77#0 or 77#1 and to transmit a voltage of the ground voltage GND level to the gate of the n-channel MOS transistor NT. Therefore, the final output stage 77#0 or 77#1 is set in an output high-impedance state (HiZ) in accordance with the output signal from the reset circuit 85#0 or 85#1.

When the output enable signals OE and /OE shift to active states of high and low levels respectively, an output circuit included in the input/output circuit 76#0 or 76#1 operates to drive the internal read data transmission lines 80 (80#0$a$ and 80#0$b$ or 80#1$a$ and 80#1$b$) in accordance with data read from the corresponding array block 75#0 or 75#1 through the sense amplifier 50$a$0 or 50$a$1. In the reset circuit 85#0 or 85#1, the CMOS transmission gates 85$a$0 and 85$b$0 or 85$a$1 and 85$b$1 conduct while the reset MOS transistors 85$c$0 and 85$d$0 or 85$c$1 and 85$d$1 enter OFF states. Thus, the final output stage 77#0 or 77#1 is supplied with internal read data transmitted from the input/output circuit 76#0 or 76#1. Due to the interconnection line capacitance of the internal read data transmission lines 80 (generically indicating the data transmission lines 80#0$a$ and 80#0$b$ or 80#1$a$ and 80#1$b$), signal propagation delay for the final output stage 77#0 or 77#1 takes place and the MOS transistors PT and NT included in the final output stage 77#0 or 77#1 relatively slowly shift to ON/OFF states in response (slew rate control). Thus, data DQ (generically indicates DQ0 or DQ1) corresponding to the internal read data appears at the data input/output node 78#0 or 78#1 with no ringing.

Data reading is completed and the output enable signals OE and /OE are driven into inactive states again. In the reset circuit 85#0 or 85#1, the CMOS transmission gates 85$a$0 and 85$b$0 or 85$a$1 and 85$b$1 enter OFF states while the reset MOS transistors 85$c$0 and 85$d$0 or 85$c$1 and 85$d$1 enter ON states again. The reset circuit 85#0 or 85#1 is arranged in proximity to the corresponding final output stage 77#0 or 77#1 and the interconnection line length L$bb$ thereof is rendered sufficiently small, whereby the reset MOS transistors 85$c$0 and 85$d$0 or 85$c$1 and 85$d$1 drive the voltages of the MOS transistors PT and NT included in the corresponding final output stage 77#0 or 77#1 into high and low levels respectively at a high speed. Thus, the data bit DQ on the data input/output node 78#0 or 78#1 enters a high-impedance state at a high speed. At this time, the output circuit of the input/output circuit 76#0 or 76#1 is similarly brought into an inactive state and the voltages of the internal read data transmission lines 80#0$a$ and 80#0$b$ or 80#1$a$ and 80#1$b$ return to prescribed voltage levels, while the voltage change speed is relatively slow by the interconnection line capacitance, due to the slew rate control. Therefore, the final output stage 77#0 or 77#1 can be set in an output high-impedance state at a high speed by electrically isolating the input/output circuit 76#0 or 76#1 from the corresponding final output stage 77#0 or 77#1 by the reset circuit 85#0 or 85#1 and setting the gate voltages of the MOS transistors PT and NT of the final output stage 77#0 or 77#1 at the prescribed voltage levels. Thus, it is possible to switch the operation mode from data reading to data writing and further switch the mode after completion of the data reading at a high speed.

Modification 1

Figure 20:
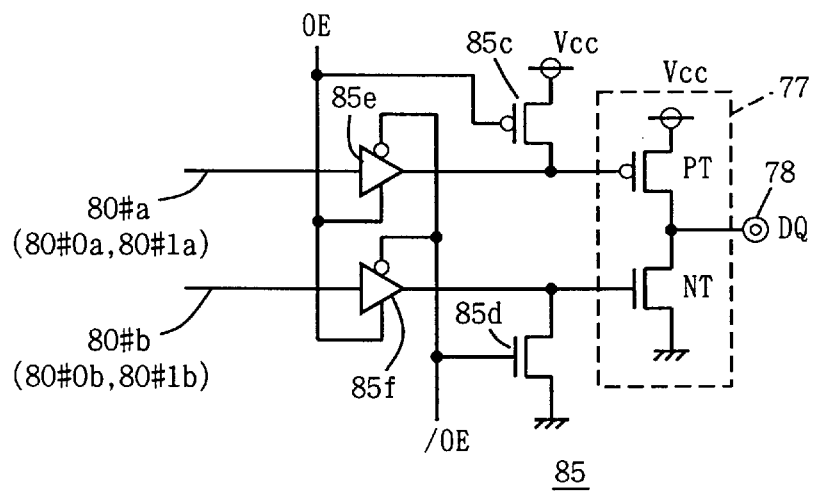
FIG. 20 illustrates a modification of a reset circuit shown in FIG. 18.

FIG. 20 illustrates the structure of a first modification of the reset circuit 85#0 or 85#1 shown in FIG. 18. This figure representatively shows only a reset circuit 85 provided for 1-bit data DQ. The reset circuit 85 shown in FIG. 20 is provided in correspondence to each data bit, i.e., each final output stage 77. The reset circuit 85 shown in FIG. 20 has tri-state buffers 85e and 85f in place of the CMOS transmission gates 85a0 and 85b0 or 85a1 and 85b1.

The tri-state buffer 85e receives a signal potential on an internal read transmission line 80#a (80#0a or 80#1a) and transmits a signal to the gate of a p-channel MOS transistor PT included in the corresponding final output stage 77 in accordance with the signal potential on the read data transmission line 80#a in activation of output enable signals OE and /OE.

The tri-state buffer 85f receives a signal potential on a read data transmission line 80#b (80#0b or 80#1b ) and is activated in activation of the output enable signals OE and /OE for transmitting a signal to the gate of an n-channel MOS transistor NT included in the corresponding final output stage 77.

Reset transistors 85c and 85d are identical in structure to those shown in FIG. 18 respectively. The p-channel MOS transistor 85c conducts in inactivation of the output enable signal OE for transmitting a voltage of a power supply voltage Vcc level to the gate of the p-channel MOS transistor PT of the corresponding final output stage 77. The n-channel MOS transistor 85d enters an ON state in inactivation of the output enable signal /OE, for transmitting a ground voltage GND to the gate of the n-channel MOS transistor NT of the corresponding final output stage 77.

The reset circuit 85 shown in FIG. 20 includes the tri-state buffers 85e and 85f in place of the CMOS transmission gates 85a0 and 85b0 or 85a1 and 85b1. The tri-state buffers 85e and 85f enter output high-impedance states at a high speed in inactivation of the output enable signals OE and /OE, for electrically isolating the read data transmission lines 80#a and 80#b from the corresponding final output stage 77. The MOS transistors 85c and 85d set the final output stage 77 in an output high-impedance state.

If the tri-state buffers 85e and 85f have high drivability, relatively slow signal change of the read data transmission lines 80#a and 80#b can be converted to rapid signal change for application to the final output stage 77. In this case, therefore, the current drivability of the tri-state buffers 85e and 85f is made relatively small. The final output stage 77 shifts to an output high-impedance state at a high speed due to the output enable signals OE and /OE, and hence reduction of the current drivability of the tri-state buffers 85e and 85f causes no particular problem. If slew rate control by the interconnection line capacitance of the internal read data transmission lines 80#a and 80#b is insufficient, the slew rate control can be finely adjusted by adjusting the current drivability of the tri-state buffers 85e and 85f.

For example, such adjustment of the current drivability can be readily implemented by providing a plurality of MOS transistors in parallel with each other in the tri-state buffer and selectively setting the parallel MOS transistors in ON/OFF states by signals from internal specific pads or the like.

Modification 2

Figure 21:
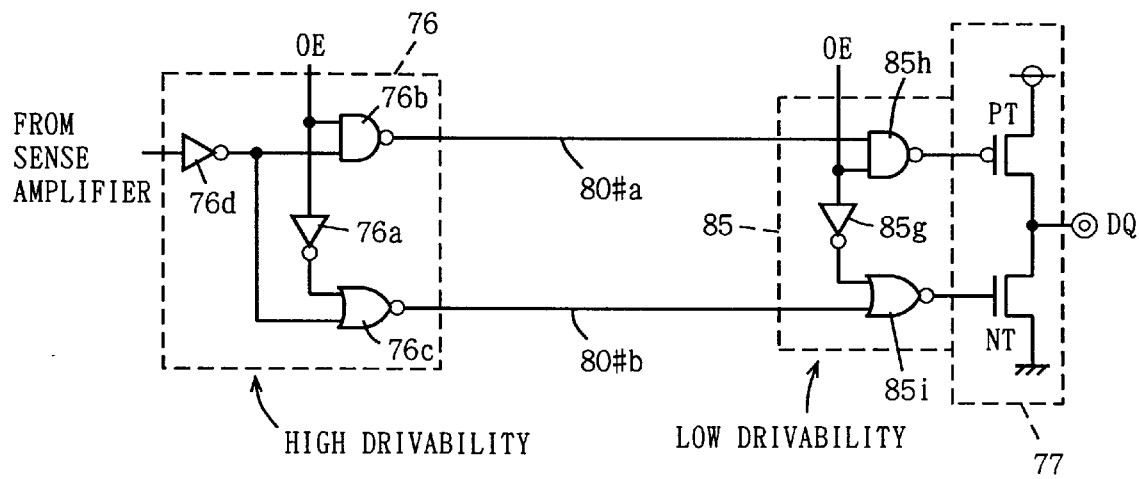
FIG. 21 illustrates another modification of the reset circuit shown in FIG. 18.

FIG. 21 illustrates the structure of a second modification of a reset circuit 85 in the embodiment 3 of the present invention. Referring to FIG. 21, the reset circuit 85 includes a NAND circuit 85h receiving a signal on an internal read data bus line 80#a and an output enable signal OE, and a NOR circuit 85i receiving a signal on an internal read data transmission line 80#b and the output enable signal OE supplied through an inverter 85g. An output signal of the NAND circuit 85h is supplied to the gate of a p-channel MOS transistor PT of a final output stage 77. An output signal of the NOR circuit 85i is supplied to the gate of an n-channel MOS transistor NT of the final output stage 77. The drivability of the NAND circuit 85h and the NOR circuit 85i of the reset circuit 85 is made relatively small.

This reset circuit 85 inverts the signal potentials on the internal read data transmission lines 80#a and 80#b respectively in activation of the output enable signal OE. Therefore, an output circuit included in an input/output circuit 76 includes an inverter 76d for inverting data read from a sense amplifier for logical matching.

This output circuit part 76 includes a structure similar to that of the output circuit shown in FIG. 13, and includes a NAND circuit 76b receiving the output enable signal OE and an output signal of the inverter 76d, and a NOR circuit 76c receiving the output signal of the inverter 76d and the output enable signal OE supplied through an inverter 76a. The NAND circuit 76b drives the internal read data transmission line 80#a, while the NOR circuit 76c drives the internal read data transmission line 80#b. The drivability of this output circuit part is made relatively large for driving large loads of the internal read data transmission lines 80#a and 80#b.

In the structure shown in FIG. 21, the reset circuit 85 relatively slowly drives the MOS transistors PT and NT of the final output stage 77 in accordance with signal change supplied from the output circuit part 76, i.e., the NAND circuit 76b and the NOR circuit 76c on the internal read data transmission lines 80#a and 80#b in activation of the output enable signal OE.

When the output enable signal OE enters an inactive state, on the other hand, the reset circuit 85 drives the MOS transistors PT and NT of the final output stage 77 into OFF states at a high speed. Thus, the final output stage 77 can be set in an output high-impedance at a high speed with no bad influence on the slew rate control utilizing the interconnection line capacitance of the internal read data transmission lines 80#a and 80#b.

Figure 22:
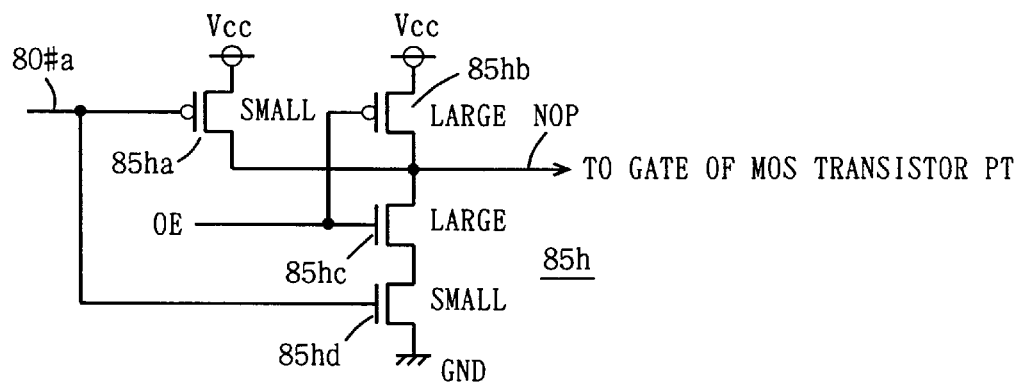
FIG. 22 illustrates an exemplary structure of a NAND circuit shown in FIG. 21.

FIG. 22 illustrates an exemplary structure of the NAND circuit 85h shown in FIG. 21. Referring to FIG. 22, the NAND circuit 85h includes a p-channel MOS transistor 85ha connected between a node (power supply node) supplying the power supply voltage Vcc and an output node NOP and receiving the signal on the internal read data transmission line 80#a in its gate, a p-channel MOS transistor 85hb connected between the power supply node and the output node NOP and receiving the output enable signal OE in its gate, and n-channel MOS transistors 85hc and 85hd serially connected between the output node NOP and a node (ground node) supplying the ground voltage GND. The MOS transistor 85hc receives the output enable signal OE in its gate, and the MOS transistor 85*hd* receives the signal on the internal read data transmission line 80#*a* in its gate.

The current drivability of the MOS transistors 85*hb* and 85*hc* receiving the output enable signal OE in the gates is rendered larger than that of the MOS transistors 85*ha* and 85*hd* receiving the signal on the read data transmission line 80#*a* in the gates. When the output enable signal OE is at a high level of an active state, the MOS transistor 85*hb* is in an OFF state, and the MOS transistors 85*ha* and 85*hd* having relatively small current drivability drive the output node NOP in accordance with the signal potential on the internal read data transmission line 80#*a*.

When the output enable signal OE shifts to an inactive state, on the other hand, the MOS transistor 85*hb* enters an ON state and charges the output node NOP to the power supply voltage Vcc level at a high speed. Thus, it is possible to perform slew rate control in accordance with signal propagation delay from the output circuit part included in the input/output circuit 76 in data output, while driving the MOS transistor PT of the final output stage 77 into an OFF state at a high speed in shifting of the output enable signal OE to an inactive state. The current drivability of the MOS transistor 85*hc* is made large for equalizing the ON-resistance of the serially connected MOS transistors 85*hc* and 85*hb* with that of the MOS transistor 85*ha* and equalizing the change speeds of the output node NOP on the leading and trailing edges of the signal with each other.

Figure 23:
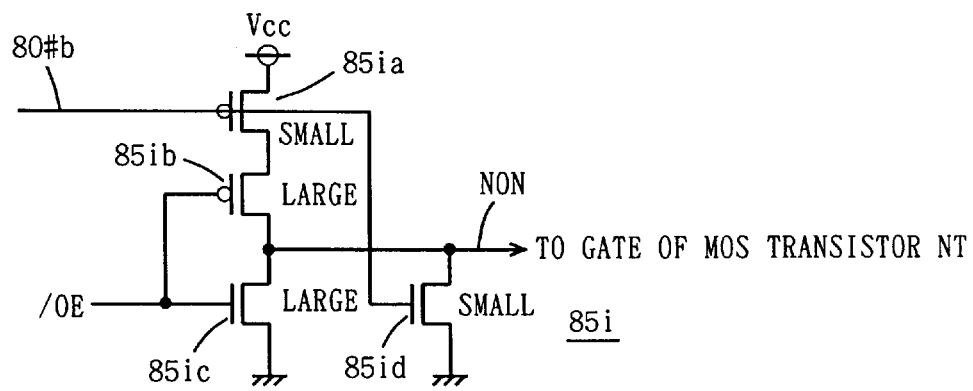
FIG. 23 illustrates an exemplary structure of a NOR circuit shown in FIG. 21.

FIG. 23 illustrates an exemplary structure of the NOR circuit 85*i* shown in FIG. 21. Referring to FIG. 23, the NOR circuit 85*i* includes p-channel MOS transistors 85*ia* and 85*ib* serially connected with each other between a power supply node Vcc and an output node NON, an n-channel MOS transistor 85*ic* connected between the output node NON and a ground node and receiving the output enable signal /OE in its gate, and an n-channel MOS transistor 85*id* connected between the output node NON and the ground node and receiving the signal on the internal read data transmission line 80#*b* in its gate.

The gate of the MOS transistor 85*ia* is connected to the internal read data transmission line 80#*b*, and the MOS transistor 85*ib* receives the output enable signal /OE in its gate. The current drivability of the MOS transistors 85*ib* and 85*ic* is rendered larger than that of the MOS transistors 85*ia* and 85*id*. The output node NON is connected to the gate of the MOS transistor NT of the final output stage 77.

When the output enable signal /OE is at a high level of an inactive state, the MOS transistor 85*ic* enters an ON state for discharging the output node NON to the ground voltage GND level at a high speed in the structure of the NOR circuit 85*i* shown in FIG. 23. When the output enable signal /OE is in an active state of a low level, on the other hand, the MOS transistors 85*ic* and 85*ib* enter OFF and ON states respectively and the MOS transistors 85*ia* and 85*id* drive the output node NON to a voltage level according to the signal potential on the internal read data transmission line 80#*b*. The current drivability of the MOS transistors 85*ia* and 85*id* is set at a relatively low level, and the gate voltage of the MOS transistor NT slowly changes in accordance with the signal potential on the internal read data transmission line 80#*b*, to cause no damage on the effect of slew rate control by interconnection line delay of the internal read transmission line 80#*b*.

If slew rate control by signal propagation delay resulting from the interconnection line capacitance of the internal read data transmission lines 80#*a* and 80#*b* is insufficient, this slew rate control can be further correctly performed by adjusting the gate widths of the MOS transistors PT and NT receiving the signal potentials of the internal read data transmission lines 80#*a* and 80#*b* at the gates through the NAND circuit 85*h* and the NOR circuit 85*i* in case of utilizing the reset circuit 85 shown in FIGS. 21 to 23. IN shifting to the output high-impedance state, further, the final output stage 77 can be set in an output high-impedance state at a high speed in accordance with the output enable signal OE.

Embodiment 4

Figure 24:
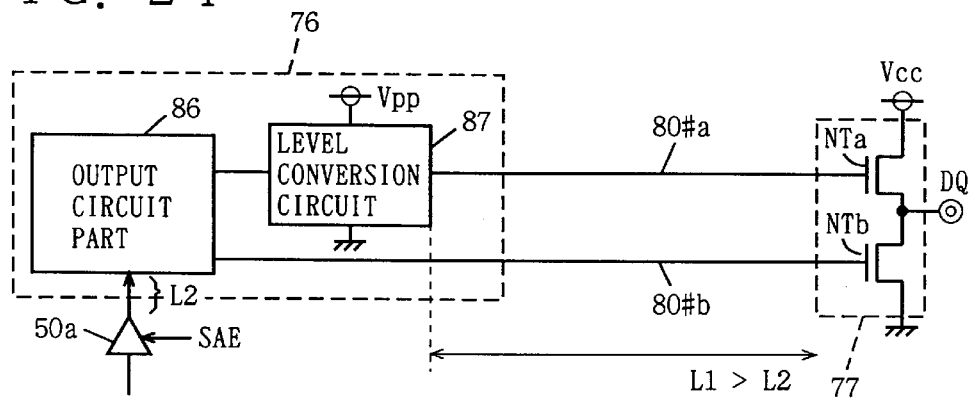
FIG. 24 schematically illustrates the structure of a principal part of a static semiconductor memory device according to an embodiment 4 of the present invention.

FIG. 24 illustrates the structure of a principal part of a static semiconductor memory device according to an embodiment 4 of the present invention. This figure representatively shows the structure of a 1-bit data output part. In the structure shown in FIG. 24, a final output stage 77 includes n-channel MOS transistors NT*a* and NT*b* serially connected between a power supply node and a ground node. The gates of the MOS transistors NT*a* and NT*b* are connected to read data transmission lines 80#*a* and 80#*b* respectively. These read data transmission lines 80#*a* and 80#*b* are connected to an output part of an input/output circuit 76 arranged physically in proximity to a sense amplifier 50*a*.

A part related to data output of the input/output circuit 76 includes an output circuit part 86 receiving an output signal of the sense amplifier 50*a*, and a level conversion circuit 87 for converting the voltage level of the signal transmitted onto the read data transmission line 80#*a* to a high voltage Vpp level higher than a power supply voltage Vcc. No level conversion circuit is provided for the read data transmission line 80#*b*.

Also in the arrangement shown in FIG. 24, the interconnection line length L2 between the sense amplifier 50*a* and the input/output circuit 76 (output circuit part 86) is rendered smaller than the interconnection line length L1 between the input/output circuit 76 and the final output stage 77, for adjusting the driving speed for an output node in the final output stage 77 through signal propagation delay by the interconnection line capacitance. The final output stage 77 includes the n-channel MOS transistors NT*a* and NT*b*. As compared with the structure of a CMOS inverter, no region is required for isolating a p-channel MOS transistor and an n-channel MOS transistor from each other and both MOS transistors NT*a* and NT*b* of the final output stage 77 can be formed in a single well region for reducing the area occupied by the final output stage 77.

The level conversion circuit 87 is provided for preventing influence by the threshold voltage of the n-channel MOS transistor NT*a* outputting high-level data.

Figure 25:
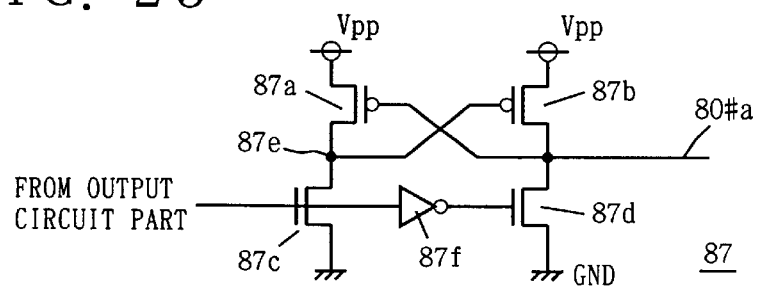
FIG. 25 illustrates an exemplary structure of a level conversion circuit shown in FIG. 24.

FIG. 25 illustrates an exemplary structure of the level conversion circuit 87 shown in FIG. 24. Referring to FIG. 25, the level conversion circuit 87 includes a p-channel MOS transistor 87*a* connected between a high-voltage power supply node and a node 87*e* with a gate connected to the read data transmission line 80#*a*, a p-channel MOS transistor 87*b* connected between the high-voltage power supply node and the read data transmission line 80#*a* with a gate connected to the node 87*e*, an n-channel MOS transistor 87*c* connected between the node 87*e* and a ground node and receiving a corresponding output signal from the output circuit part 86 in its gate, and an n-channel MOS transistor 87*d* connected between the read data transmission line 80#*a* and the ground node for receiving a corresponding output signal from the output circuit part 86 in its gate through an inverter 87*f*.

When the signal supplied from the output circuit part 86 is at a high level, the MOS transistors 87c and 87d enter ON and OFF states respectively in the level conversion circuit 87. In this state, the node 87e is discharged to the ground voltage level through the MOS transistor 87c, the MOS transistor 87b enters an ON state, and the voltage of the read data transmission line 80#a reaches the high voltage Vpp level. In this state, the MOS transistor 87a enters an OFF state.

When the signal from the output circuit part 86 is at a low level, on the other hand, the MOS transistors 87c and 87d enter OFF and ON states respectively, and the read data transmission line 80#a is discharged to the ground voltage level. In response to this reduction of the voltage level on the read data transmission line 80#a, the MOS transistor 87a enters an ON state, the voltage of the internal node 87e reaches the high voltage Vpp level, and the MOS transistor 87b enters an OFF state. Therefore, the level conversion circuit 87 shown in FIG. 25 converts the signal supplied from the output circuit part 86 to the high voltage Vpp level and outputs the same.

Figure 26:
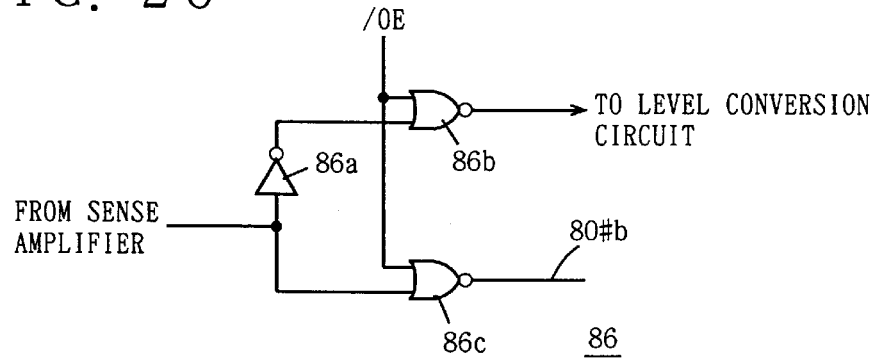
FIG. 26 illustrates an exemplary structure of an output circuit part shown in FIG. 24.

FIG. 26 illustrates an exemplary structure of the output circuit part 86 shown in FIG. 24. Referring to FIG. 26, the output circuit part 86 includes an inverter 86a for inverting data read from the sense amplifier 50a, a NOR circuit 86b receiving an output signal of the inverter 86a and an output enable signal /OE, and a NOR circuit 86c receiving the output enable signal /OE and internal read data read from the sense amplifier 50a. An output signal from the NOR circuit 86b is supplied to the level conversion circuit 87 shown in FIG. 24. An output signal from the NOR circuit 86c is supplied to the gate of the MOS transistor NTb of the final output stage 77 through the internal data transmission line 80#b.

The output enable signal /OE is at a high level in an inactive state. In this state, the output signals of the NOR circuits 86b and 86c go low, the n-channel MOS transistors NTa and NTb (see FIG. 24) of the final output stage 77 enter OFF states, and the final output stage 77 enters an output high-impedance state.

When the output enable signal /OE goes low, the NOR circuits 86b and 86c serve as inverters. When the internal read data read from the sense amplifier 50a is at a high level, the output signals from the NOR circuits 86b and 86c go high and low respectively. Therefore, the MOS transistor NTa enters an ON state and the final output stage 77 outputs high-level data DQ.

When the internal read data from the sense amplifier 50a is at a low level, on the other hand, the output signals of the NOR circuits 86b and 86c go low and high respectively, the MOS transistor NTb enters an ON state, and the final output stage 77 outputs low-level data.

Also when the output part shown in FIGS. 24 to 26 is employed, the change speed of the gate voltages of the MOS transistors NTa and NTb of the final output stage 77 is relatively slow due to the interconnection line capacitance in the internal read data transmission lines 80#a and 80#b, the output node can be prevented from being driven at a high speed, and data can be stably read with no ringing.

Modification

Figure 27:
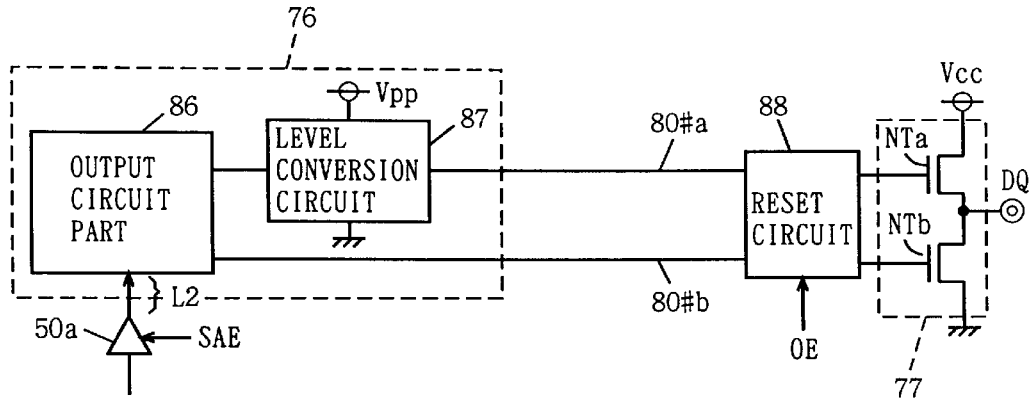
FIG. 27 schematically illustrates the structure of a modification of the static semiconductor memory device according to the embodiment 4 of the present invention.
Figure 28:
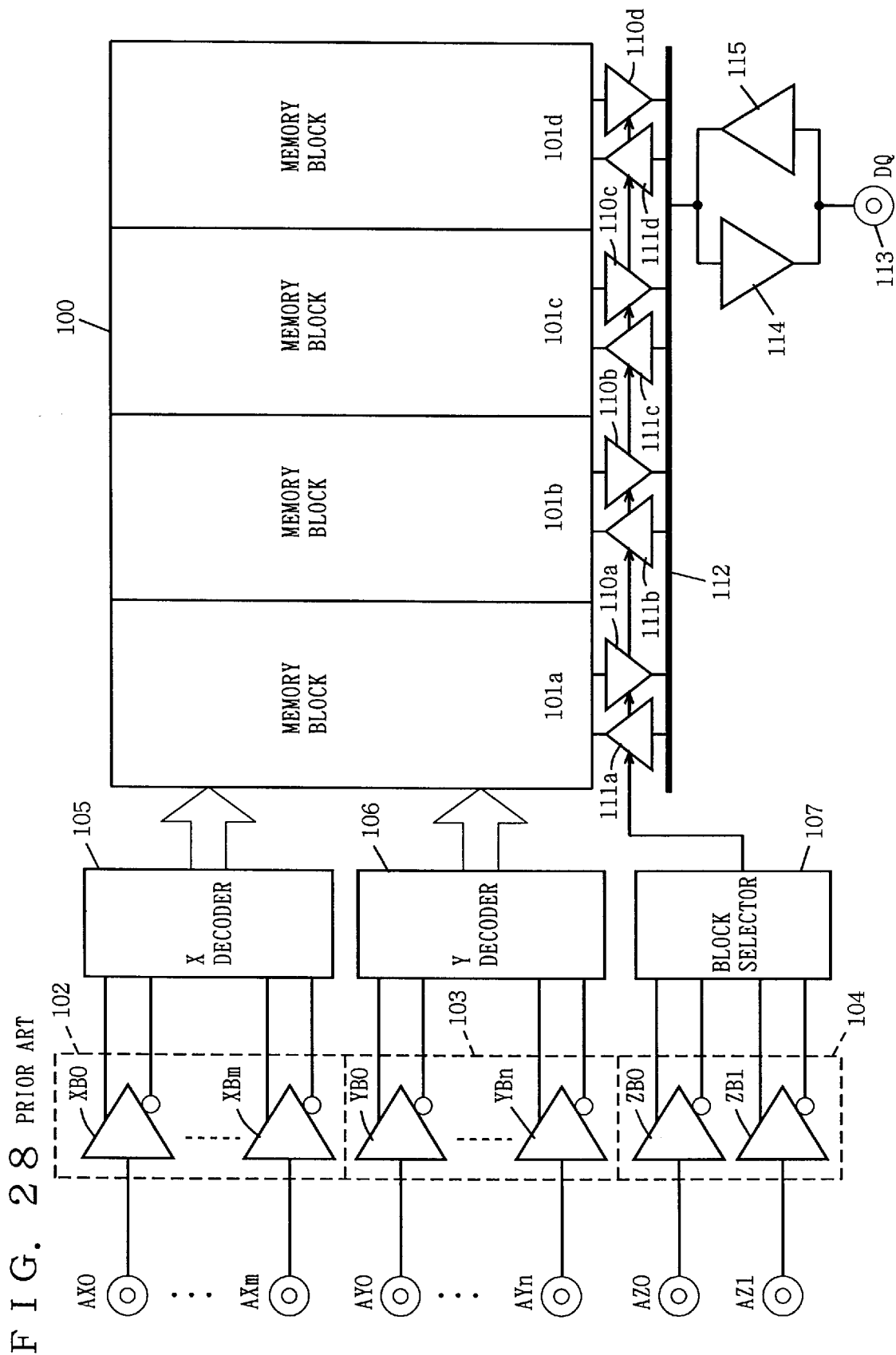
FIG. 28 schematically illustrates the overall structure of a conventional static semiconductor memory device.
Figure 29:
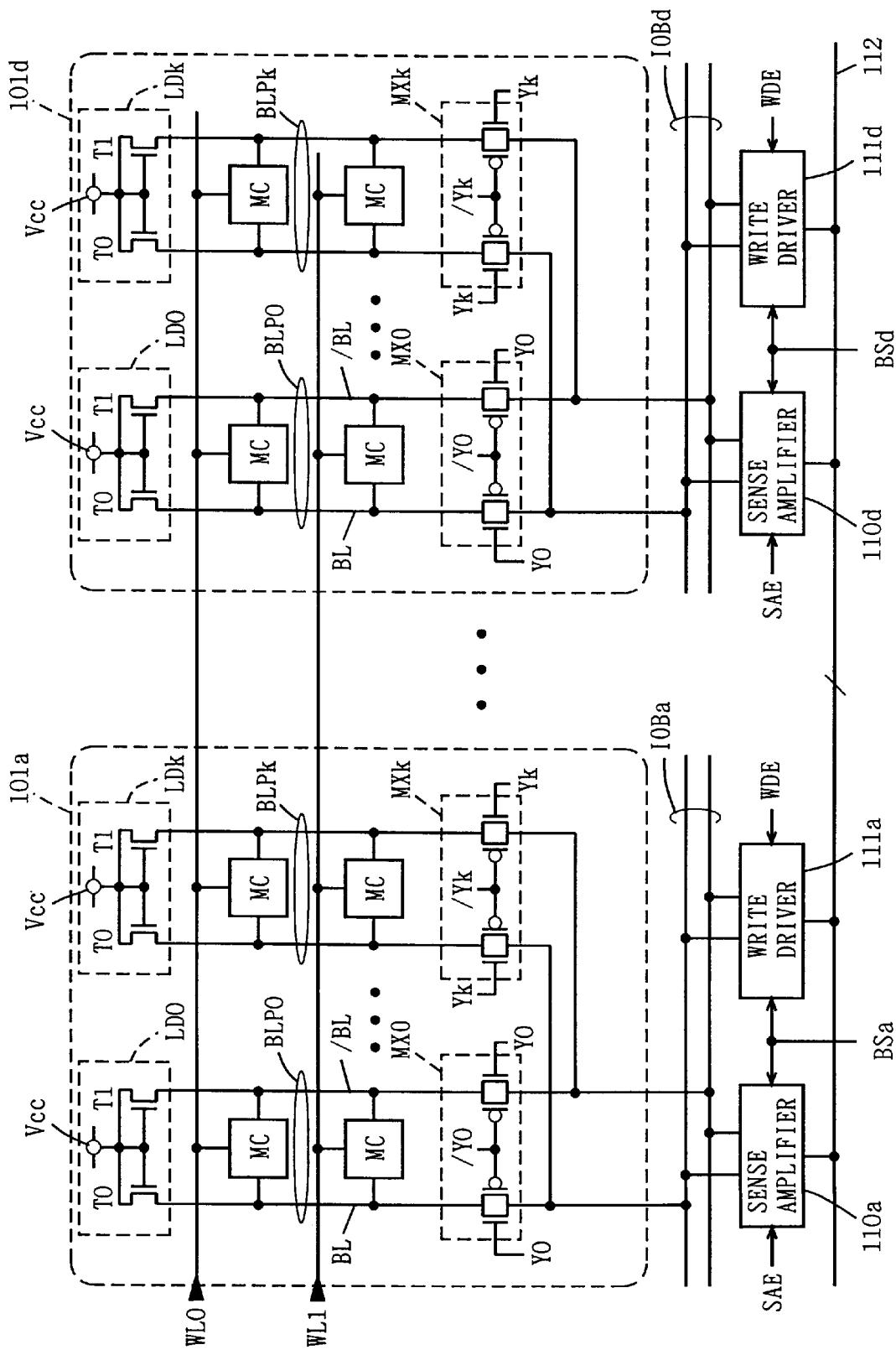
FIG. 29 illustrates an exemplary structure of memory blocks of the conventional static semiconductor memory device.
Figure 30:
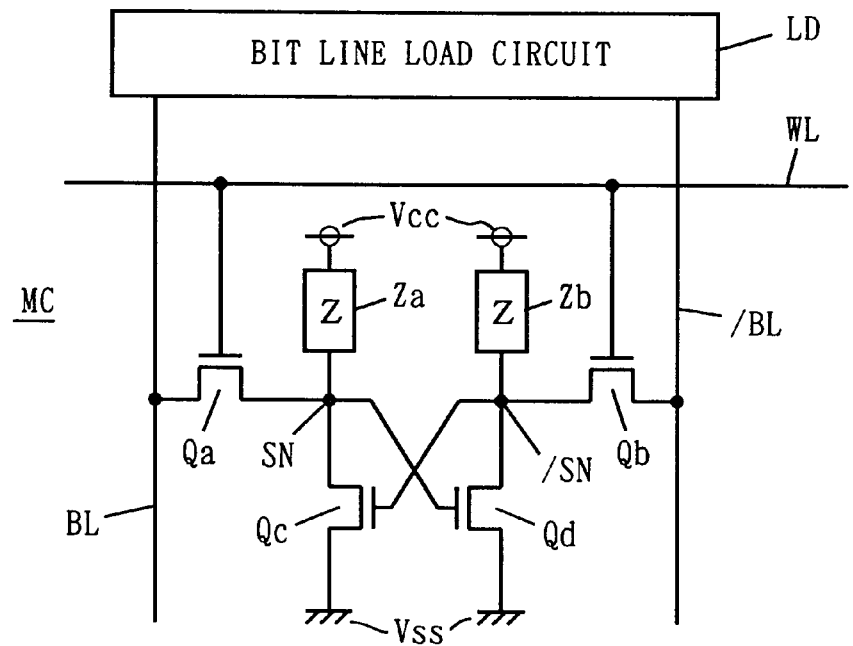
FIG. 30 illustrates the structure of a static memory cell shown in FIG. 29.
Figure 31:
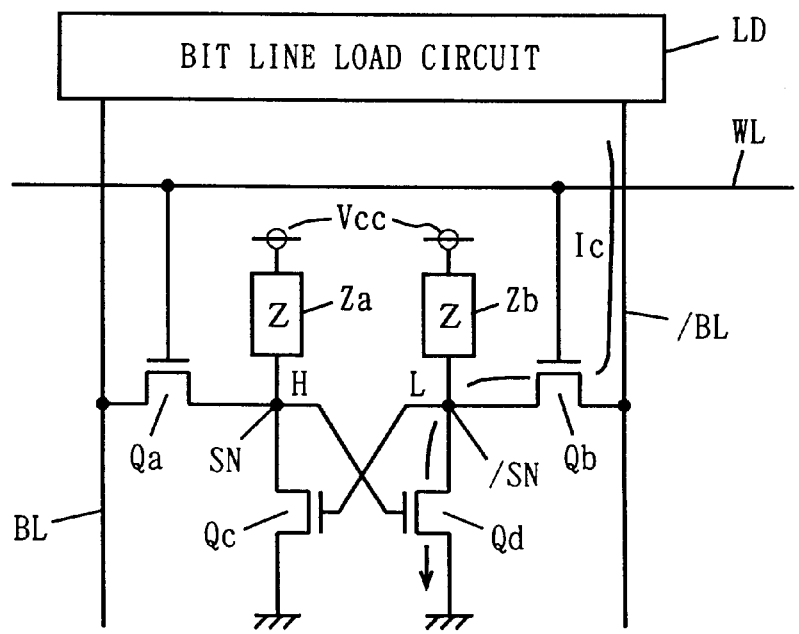
FIG. 31 illustrates an operation of the static memory cell shown in FIG. 30.
Figure 33:
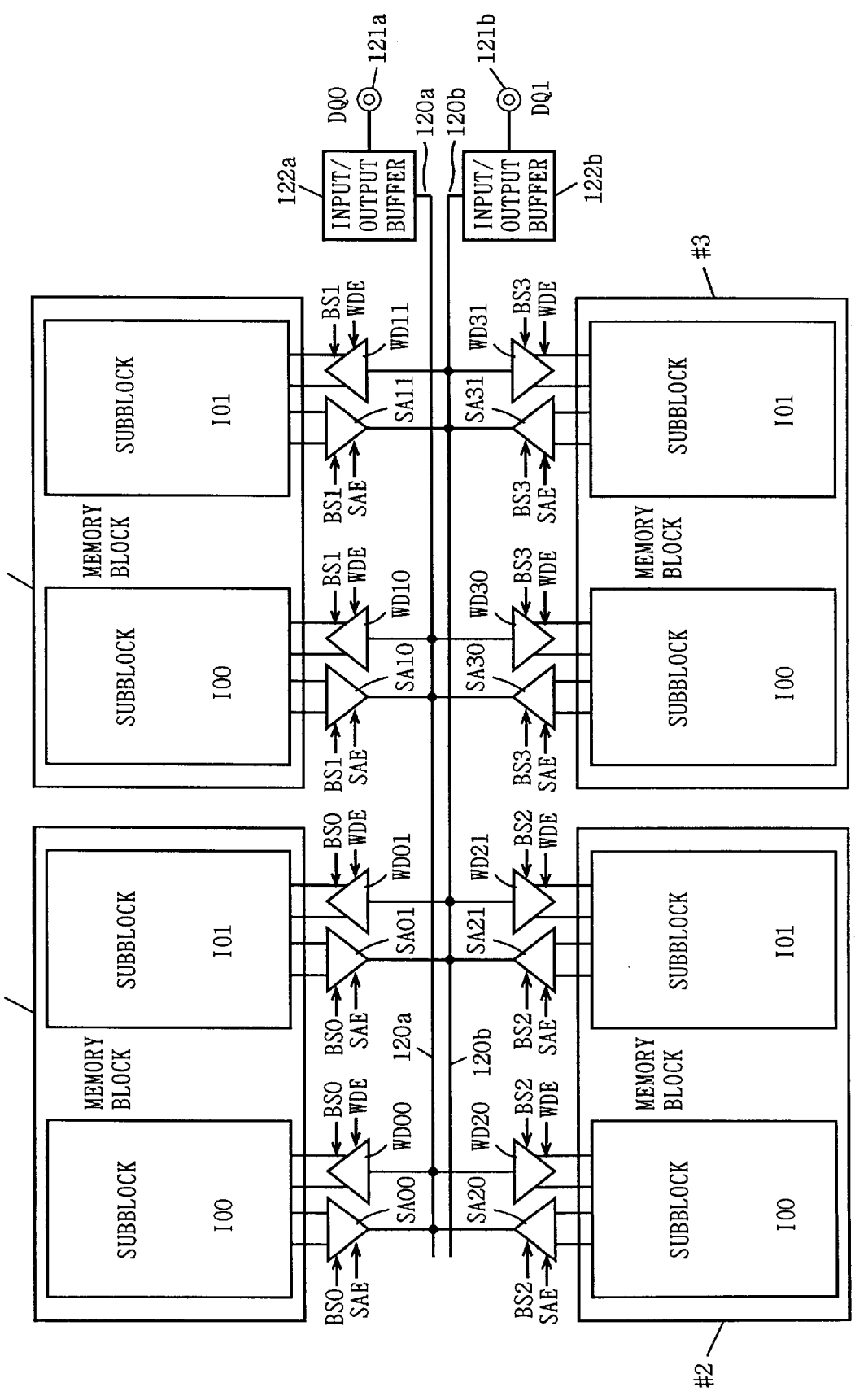
FIG. 33 schematically illustrates the overall structure of a conventional multi-bit static semiconductor memory device.

FIG. 27 illustrates the structure of a modification of the embodiment 4 of the present invention. In the structure shown in FIG. 27, a reset circuit 88 is provided for read data transmission lines 80#a and 80#b in proximity to a final output stage 77, in addition to the structure shown in FIG. 24. This reset circuit 88 transmits a low-level voltage to the gates of MOS transistors NTa and NTb included in the final output stage 77 in inactivation of an output enable signal OE for setting the final output stage 77 in an output high-impedance state and electrically isolating the same from an input/output circuit 76. This reset circuit 88 can be formed by the structure provided for the n-channel MOS transistor NT in the embodiment 3, i.e., the structure of CMOS transmission gates and n-channel MOS transistors.

Further, either a combination of tri-state buffers and MOS transistors for resetting to a low level or a structure employing logic gates can be utilized. In case of employing transmission gates or logic gates, one power source is at a high voltage Vpp, that is, high levels of signals OE and /OE are at a high voltage Vpp level, so that a part related to the MOS transistor NTa can transmit the high voltage Vpp. The reset circuit is only required to bring the output signal thereof to a low level while electrically isolating the input/output circuit 76 from the final output stage 77 in inactivation of the output enable signal OE, and to electrically connect the input/output circuit 76 with the final output stage 77 in activation of the output enable signal OE. The final output stage 77 can be driven into an output highimpedance state at a high speed, mode switching is performed at a high speed by employing the reset circuit 88, similarly to the embodiment 3.

Each of the structures according to the embodiments 2 and 3 is provided for 2-bit data. However, the number of data bits can be arbitrarily selected so far as memory blocks are individually provided for the respective data bits independently of each other.

According to the present invention, as hereinabove described, memory blocks are provided in correspondence to data bits respectively and word lines are driven into selected states in units of the memory blocks, whereby sense amplifiers and write drivers can be provided in numbers corresponding to that of the data bits and the chip occupied area can be reduced. Further, internal data buses has only to have the minimum necessary length, the data buses need not be arranged for all memory blocks, and the capacitance of the buses can be reduced, resulting in implementation of high-speed data transfer and low current consumption.

Further, an input/output circuit part is arranged in proximity to a write driver and a sense amplifier for each memory block and only a data output final stage is arranged in proximity to an input/output pad, whereby slew rate control can be implemented through interconnection line delay for correctly outputting data at a high speed. In addition, the final output stage can be set in an output high-impedance state at a high speed by arranging a reset circuit in proximity thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device comprising:
   a plurality of data input/output nodes;
   a plurality of memory array blocks arranged in correspondence to said plurality of data input/output nodes respectively, for transferring and receiving data to and from corresponding data input/output nodes respectively, each of said plurality of memory array blocks having a plurality of memory cells arranged in rows and columns, a plurality of word lines arranged in correspondence to the respective rows and connecting the memory cells of the corresponding rows respectively, and a plurality of bit line pairs arranged in correspondence to the respective columns and connecting the memory cells of the corresponding columns respectively, each of the memory cells including a bipolar transistor coupled with a corresponding bit line pair and a data storage unit formed by insulated gate field-effect transistors transferring and receiving a data signal to and from bit lines of said corresponding bit line pair through said bipolar transistor, and each of the word lines of each of the memory array blocks being electrically isolated from a word line in any other memory array block.

2. The static semiconductor memory device in accordance with claim 1, further comprising:

a plurality of internal data buses arranged in correspondence to the respective memory array blocks for transferring data signals between corresponding memory array blocks and corresponding data input/output nodes, a plurality of internal read circuits arranged in correspondence to said plurality of memory array blocks respectively, for amplifying data read from selected memory cells of the corresponding memory array blocks, a plurality of bus driving circuits arranged in correspondence to the respective memory array blocks physically in proximity to the corresponding memory array blocks for driving corresponding ones of said plurality of internal data buses in accordance with said data signals from the corresponding internal read circuits, and a plurality of output stages arranged in correspondence to said plurality of data input/output nodes respectively in proximity to the corresponding data input/output nodes, for driving the corresponding data input/output nodes in accordance with signals on the corresponding internal data buses and generating external output data respectively, wherein interconnection line lengths between respective said internal read circuits and the corresponding bus driving circuits being smaller than the interconnection line lengths between the corresponding bus driving circuits and the corresponding data input/output nodes.

3. The static semiconductor memory device in accordance with claim 2, further comprising a plurality of output control circuits arranged in correspondence to said plurality of internal data buses respectively in proximity to corresponding output stages, for inactivating the corresponding output stages in response to inactivation of a data output instruction signal, each of the bus driving circuits being activated in response to activation of said data output instruction signal.

4. The static semiconductor memory device in accordance with claim 1, further comprising:

a plurality of input circuits arranged in correspondence to said plurality of memory array blocks respectively in proximity to corresponding memory array blocks, for generating internal write data in accordance with supplied external write data, a plurality of input data transmission lines arranged between respective data input/output nodes and the input circuits for corresponding memory array blocks, for transmitting data supplied onto corresponding data input/output nodes to the corresponding input circuits, and a plurality of write circuits arranged in correspondence to respective input circuits for generating write data for selected memory cells of the corresponding memory array blocks in accordance with said internal write data from the corresponding input circuits.

5. The static semiconductor memory device in accordance with claim 2, wherein each the output stage includes a pair of insulated gate field-effect transistors connected between first and second power supply nodes and complementarily brought into a conducting state in accordance with a data signal on the corresponding internal data bus in a data output mode, for transmitting the voltage of either the first or second power supply node to the corresponding data input/output node.

6. The static semiconductor memory device in accordance with claim 3, wherein each the output control circuit comprises:

isolation circuit for isolating a corresponding output stage from a corresponding output driving circuit in inactivation of said data output instruction signal, and reset circuit for inactivating the corresponding output stage in inactivation of said data output instruction signal.

7. The static semiconductor memory device in accordance with claim 3, wherein each the output control circuit includes gate circuit generating a signal for setting the corresponding output stage in an output high-impedance state for application to said corresponding output stage in inactivation of said data output instruction signal regardless of the logical level of a signal outputted from the corresponding bus driving circuit.

8. The static semiconductor memory device in accordance with claim 1, wherein each of the memory array blocks further includes bit line read circuits provided corresponding to the respective bit lines in the memory array block and responsive to a column selection signal and a read mode instruction signal instructing a data read operation for causing a current flow on the corresponding bit lines on a column designated by the column selection signal.

9. The static semiconductor memory device in accordance with claim 4, wherein interconnection lines between the input/output nodes and the respective input circuits are shorter than interconnection lines between the input circuits and the respective write circuits.

10. The static semiconductor memory device in accordance with claim 1, wherein said plurality of data input/output nodes comprises a plurality of pads arranged physically in proximity to the corresponding memory array blocks.

11. The static semiconductor memory device according to claim 10, wherein said plurality of memory array blocks are divided into two groups with respect to a central region, and said plurality of pads are arranged in said central region.

12. The static semiconductor memory device in accordance with claim 10, wherein said plurality of memory array blocks are divided into two groups with respect to a central region extending in a first direction, and said plurality of pads are arranged on opposing sides of said central region with respect to the first direction.

13. The static semiconductor memory device in accordance with claim 10, wherein said plurality of memory array blocks are divided into two groups with respect to a central region, and said plurality of pads are arranged on outer sides opposing to the central region with respect to the two groups of the memory array blocks.

14. The static semiconductor memory device in accordance with claim 6, wherein said isolation circuit comprises a gate driven into a non-conductive state in response to the inactivation of said data output instruction signal.

15. The static semiconductor memory device in accordance with claim 6, wherein said isolation circuit comprises a three-state buffer driven into an output high impedance state in response to the inactivation of said data output instruction signal.

16. The static semiconductor memory device in accordance with claim 3, wherein the output control circuit comprises a gate circuit having a current drivability of the bus driving circuit and driving a corresponding output stage into an output high impedance state in response to the impedance state in response to the inactivation of the data output instruction signal.

17. The static semiconductor memory device in accordance with claim 16, wherein the gate circuit and the bus driving circuit have a same common logic configuration.

18. The static semiconductor memory device in accordance with claim 2, wherein the output stage includes insulated gate type field effect transistor of a same common conductivity type, and the bus driving circuit includes a level converter for converting a voltage level of a received data signal for transmission onto a corresponding internal data bus.

19. The semiconductor memory device in accordance with claim 1, wherein the input/output node comprises a common node receiving an externally applied data signal and providing an external data signal.

* * * * *